US012463021B2

(12) United States Patent
Endo et al.

(10) Patent No.: US 12,463,021 B2
(45) Date of Patent: Nov. 4, 2025

(54) SUBSTRATE PROCESSING APPARATUS AND MAINTENANCE METHOD FOR SUBSTRATE PROCESSING APPARATUS

(71) Applicant: Tokyo Electron Limited, Tokyo (JP)

(72) Inventors: Hiroki Endo, Miyagi (JP); Nozomu Nagashima, Miyagi (JP); Suguru Sato, Miyagi (JP); Koei Ito, Miyagi (JP); Taisei Seguchi, Miyagi (JP); Dai Kitagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 588 days.

(21) Appl. No.: 17/903,882

(22) Filed: Sep. 6, 2022

(65) Prior Publication Data

US 2023/0071478 A1 Mar. 9, 2023

(30) Foreign Application Priority Data

Sep. 6, 2021 (JP) ................................ 2021-144494
Mar. 25, 2022 (JP) ................................ 2022-049553
Aug. 29, 2022 (JP) ................................ 2022-136129

(51) Int. Cl.
*H01J 37/32* (2006.01)

(52) U.S. Cl.
CPC .... *H01J 37/32715* (2013.01); *H01J 37/3244* (2013.01); *H01J 37/32513* (2013.01); *H01J 37/32091* (2013.01)

(58) Field of Classification Search
CPC ............ H01J 37/32715; H01J 37/3244; H01J 37/32513; H01J 37/32091; H01J 37/3288; H01J 37/32449; C23C 16/45561
USPC ....................... 118/715; 156/345.33, 345.34
See application file for complete search history.

(56) References Cited

U.S. PATENT DOCUMENTS 6,170,432 B1 * 1/2001 Szapucki ............ H01J 37/3244 156/345.34
6,220,202 B1 * 4/2001 Foster .............. C23C 16/45565 118/715
7,543,547 B1 * 6/2009 Kennedy ........... H01J 37/32009 118/723 R
8,568,554 B2 * 10/2013 Hayashi .............. H01J 37/3244 156/345.43
8,573,152 B2 * 11/2013 de la Llera ............ H01R 13/20 156/345.46

(Continued)

FOREIGN PATENT DOCUMENTS

JP 2019-197849 A 11/2019

*Primary Examiner* — Rudy Zervigon
(74) *Attorney, Agent, or Firm* — XSENSUS LLP

(57) ABSTRACT

There is a substrate processing apparatus comprising: a chamber including a sidewall having an opening; a substrate support disposed in the chamber; a support member disposed above the substrate support; an inner wall member having a ceiling portion disposed above the substrate support and below the support member; a contact member attached to one of the support member and the inner wall member and configured to detachably fix the inner wall member to the support member by applying a spring reaction force to the other of the support member and the inner wall member in a horizontal direction; and an actuator configured to move the inner wall member downward to release the fixing of the inner wall member to the support member.

31 Claims, 31 Drawing Sheets

(56) References Cited

U.S. PATENT DOCUMENTS 8,858,754 B2 * 10/2014 Horiguchi ........... H01J 37/3244
156/345.43
9,460,893 B2 * 10/2016 Kawamata ........ H01J 37/32091
11,004,707 B1 * 5/2021 Kilpi ................. H01J 37/32522
11,380,523 B2 * 7/2022 Yamaguchi ............... C23F 1/12
12,040,166 B2 * 7/2024 Sawachi ............. H01L 21/6831
12,347,660 B2 * 7/2025 Sawachi ........... H01L 21/67167
2002/0108711 A1 * 8/2002 Kim .................... H01J 37/3244
156/345.33
2003/0215569 A1 * 11/2003 Mardian ............... C23C 16/455
427/248.1
2004/0206305 A1 * 10/2004 Choi ................... C23C 16/5096
118/715
2004/0261712 A1 * 12/2004 Hayashi ............ H01L 21/67069
118/723 E
2005/0003600 A1 * 1/2005 Kasai ................ C23C 16/45521
257/E21.585
2005/0028732 A1 * 2/2005 Mardian ........... C23C 16/45565
118/715
2005/0241579 A1 * 11/2005 Kidd ................... H01J 37/3244
427/248.1
2006/0213617 A1 * 9/2006 Fink .................. H01J 37/32495
156/345.47
2008/0087641 A1 * 4/2008 de la Llera ....... H01J 37/32541
438/689
2009/0183832 A1 * 7/2009 Nakagawa ........ H01J 37/32431
156/345.1
2010/0003824 A1 * 1/2010 Kadkhodayan ... H01J 37/32568
118/723 R
2010/0038033 A1 * 2/2010 Hardin ................ H01J 37/3255
204/298.07
2010/0043975 A1 * 2/2010 Hayashi .............. H01J 37/3244
156/345.33
2010/0243166 A1 * 9/2010 Hayashi ............ H01J 37/32568
156/345.34
2010/0243167 A1 * 9/2010 Hayashi ............ H01J 37/32458
156/345.43
2011/0008955 A1 * 1/2011 Horii ................. C23C 16/45561
118/704
2011/0070740 A1 * 3/2011 Bettencourt ........ H01J 37/3244
118/723 MP
2011/0083809 A1 * 4/2011 de la Llera ....... H01J 37/32091
156/345.34
2011/0132873 A1 * 6/2011 Tsujimoto ......... H01L 21/68742
118/712
2011/0197814 A1 * 8/2011 Baek ................... H01J 37/3244
118/723 E
2011/0220609 A1 * 9/2011 Yaegashi ........... H01L 21/31116
156/345.43
2011/0240224 A1 * 10/2011 Yoshimura ........ H01J 37/32091
156/345.47
2011/0318934 A1 * 12/2011 Wada .................. H01J 37/3255
438/714
2011/0318935 A1 * 12/2011 Oyabu .............. H01J 37/32091
438/723
2012/0027918 A1 * 2/2012 Tiner ................ C23C 16/45565
118/715
2012/0175062 A1 * 7/2012 de la Llera ....... H01J 37/32532
156/345.34
2013/0071581 A1 * 3/2013 Baek ......................... H05H 1/46
315/111.21
2013/0220545 A1 * 8/2013 Koizumi ........... H01L 21/67103
279/128
2014/0109940 A1 * 4/2014 Ohashi .............. H01J 37/32862
134/37
2014/0116620 A1 * 5/2014 Kuwabara ............ C23C 16/509
156/345.24
2014/0193977 A1 * 7/2014 Kawamata ........ H01J 37/32449
156/345.26
2014/0234992 A1 * 8/2014 Kubota ............. H01L 21/76813
438/9
2014/0284308 A1 * 9/2014 Matsuyama ...... H01J 37/32366
156/345.44
2015/0024603 A1 * 1/2015 Kitamura .......... H01L 21/30655
438/711
2017/0081763 A1 * 3/2017 Tiner ................ C23C 16/45565
2019/0066983 A1 * 2/2019 Sung ................... H01L 21/6719
2020/0071833 A1 * 3/2020 Lau ................... C23C 16/45591
2022/0122818 A1 * 4/2022 Sawachi ............. H01L 21/6831
2023/0071478 A1 * 3/2023 Endo ................. H01J 37/32715
2023/0131199 A1 * 4/2023 Ito ..................... H01J 37/32458
315/111.21
2023/0279547 A1 * 9/2023 Shankarnarayana ........................
H01J 37/32605
118/715
2025/0191886 A1 * 6/2025 Kim .................... H01J 37/3244
2025/0201537 A1 * 6/2025 Seguchi ............ H01J 37/32715

* cited by examiner

SUBSTRATE PROCESSING APPARATUS AND MAINTENANCE METHOD FOR SUBSTRATE PROCESSING APPARATUS

CROSS-REFERENCE TO RELATED APPLICATIONS

This application claims priority to Japanese Patent Application No. 2021-144494 filed on Sep. 6, 2021, Japanese Patent Application No. 2022-049553 filed on Mar. 25, 2022, and Japanese Patent Application No. 2022-136129 filed on Aug. 29, 2022, respectively, the entire contents of which are incorporated herein by reference and priority is claimed to each.

TECHNICAL FIELD

Embodiments of the present disclosure relate to a substrate processing apparatus and a maintenance method for the substrate processing apparatus.

BACKGROUND

A substrate processing apparatus is used to process a substrate. A substrate processing apparatus includes a chamber and a substrate support. The substrate support supports a substrate in the chamber. The substrate is processed in the chamber. In a plasma processing apparatus that is an example of the substrate processing apparatus, a substrate is processed using chemical species from plasma produced from a processing gas in the chamber. Japanese Laid-open Patent Publication No. 2019-197849 discloses such a plasma processing apparatus.

SUMMARY

The present disclosure provides a technique capable of easily performing maintenance of an inner wall member of a substrate processing apparatus.

In accordance with an aspect of the present disclosure, there is a substrate processing apparatus comprising: a chamber including a sidewall having an opening; a substrate support disposed in the chamber; a support member disposed above the substrate support; an inner wall member having a ceiling portion disposed above the substrate support and below the support member; a contact member attached to one of the support member and the inner wall member and configured to detachably fix the inner wall member to the support member by applying a spring reaction force to the other of the support member and the inner wall member in a horizontal direction; and an actuator configured to move the inner wall member downward to release the fixing of the inner wall member to the support member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
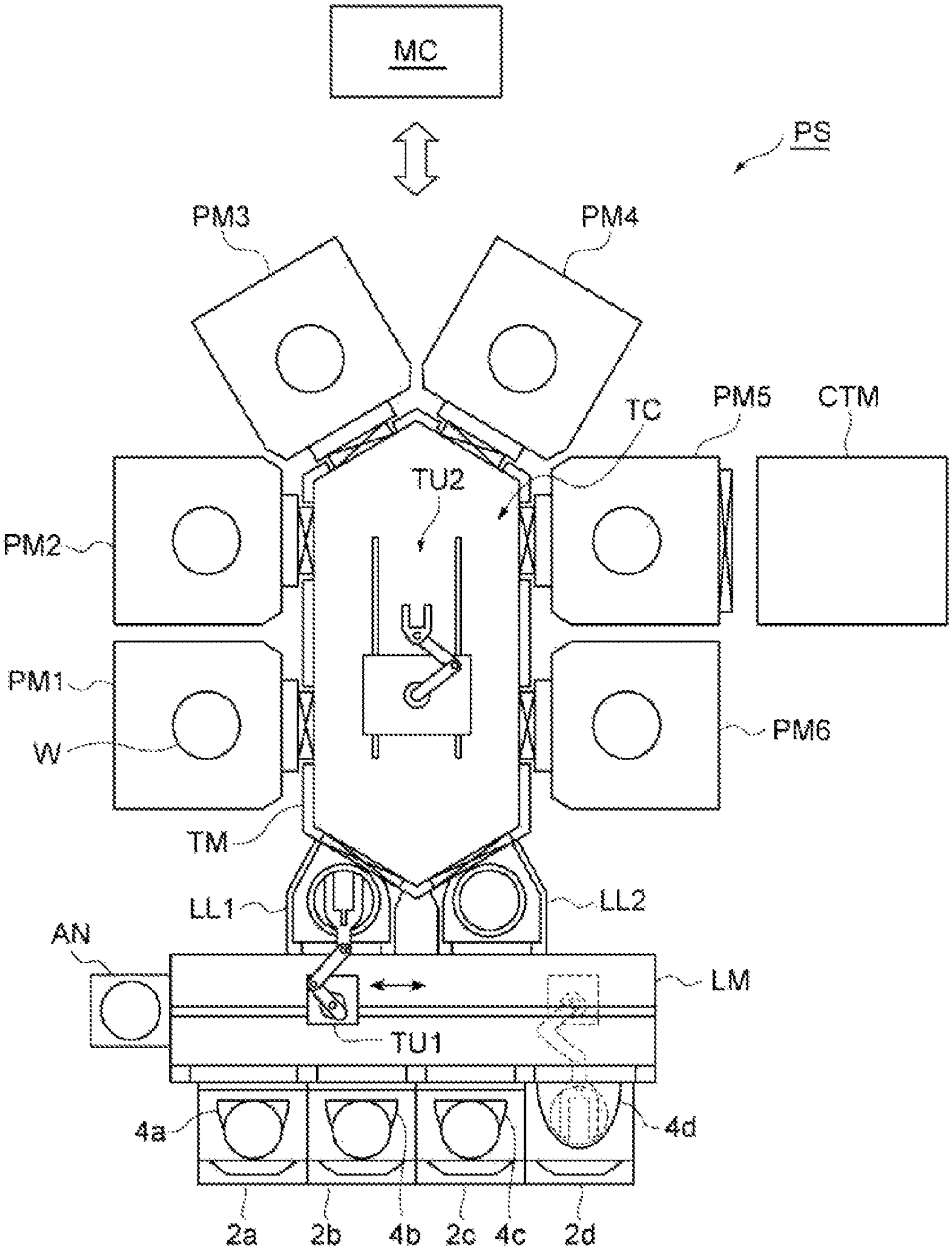
FIG. 1 illustrates a substrate processing system according to one embodiment.

Hereinafter, various embodiments will be described in detail below with reference to the accompanying drawings.

Further, like reference numerals will be given to like or corresponding parts throughout the drawings.

FIG. 1 shows a substrate processing system according to one embodiment. A substrate processing system PS shown in FIG. 1 includes process modules PM1 to PM6, a transfer module CTM, and a controller MC.

The substrate processing system PS may further include tables 2*a* to 2*d*, containers 4*a* to 4*d*, an aligner AN, load-lock modules LL1 and LL2, and a transfer module TM. The number of tables, the number of containers, and the number of load-lock modules in the substrate processing system PS may be one or more. Further, the number of process modules in the substrate processing system PS may be one or more.

The tables 2*a* to 2*d* are arranged along one edge of the loader module LM. The containers 4*a* to 4*d* are placed on the tables 2*a* to 2*d*, respectively. Each of the containers 4*a* to 4*d* is referred to as a front opening unified pod (FOUP), for example. Each of the containers 4*a* to 4*d* is configured to accommodate substrates W therein.

The loader module LM has a chamber. A pressure in the chamber of the loader module LM is set to an atmospheric pressure. The loader module LM has a transfer device TU1. The transfer device TU1 is a transfer robot, for example, and is controlled by the controller MC. The transfer device TU1 is configured to transfer the substrate W through the chamber of the loader module LM. The transfer device TU1 can transfer the substrate W between each of the containers 4*a* to 4*d* and the aligner AN, between the aligner AN and each of the load-lock modules LL1 and LL2, and between each of the load-lock modules LL1 and LL2 and each of the containers 4*a* to 4*d*. The aligner AN is connected to the loader module LM. The aligner AN is configured to adjust a position of the substrate W (calibration of the position).

Each of the load-lock modules LL1 and LL2 is disposed between the loader module LM and the transfer module TM. Each of the load-lock modules LL1 and LL2 provides a preliminary decompression chamber. Each of the load-lock modules LL1 and LL2 is connected to the loader module LM through a gate valve. Each of the load-lock modules LL1 and LL2 is connected to the transfer module TM through a gate valve.

The transfer module TM has a transfer chamber TC whose inner pressure can be reduced. The transfer module TM has a transfer device TU2. The transfer device TU2 is a transfer robot, for example, and is controlled by the controller MC. The transfer device TU2 is configured to transfer the substrate W through the transfer chamber TC. The transfer device TU2 can transfer the substrate W between each of the load-lock modules LL1 and LL2 and each of the process modules PM1 to PM6 and between any two process modules among the process modules PM1 to PM6.

Each of the process modules PM1 to PM6 is connected to the transfer module TM through a gate valve. Each of the process modules PM1 to PM6 is configured to perform dedicated substrate processing. At least one of the process modules PM1 to PM6 is a substrate processing apparatus according to one embodiment to be described below.

The transfer module CTM has a chamber and a transfer device. The transfer module CTM is controlled by the controller MC. The transfer module CTM is movable to be connected to the chamber of the substrate processing apparatus. Further, the transfer module CTM is configured to connect an inner space of the chamber of the substrate processing apparatus and an inner space of the chamber of the transfer module CTM in a state where the inner spaces thereof are depressurized. The transfer device of the transfer module CTM has a transfer arm CA (see FIG. 7). The transfer arm CA is configured to transfer an inner wall member of the substrate processing apparatus between the inner space of the chamber of the substrate processing apparatus (in one example, the inner space of the chamber of the transfer module CTM) and the outside of the chamber.

The controller MC is configured to control individual components of the substrate processing system PS. The controller MC may be a computer including a processor, a storage device, an input device, a display device, and the like. The controller MC executes a control program stored in the storage device and controls the individual components of the substrate processing system PS based on a recipe data stored in the storage device. A maintenance method according to one embodiment, which will be described later, can be performed in the substrate processing system PS by controlling the individual components of the substrate processing system PS under the control of the controller MC.

Figure 2:
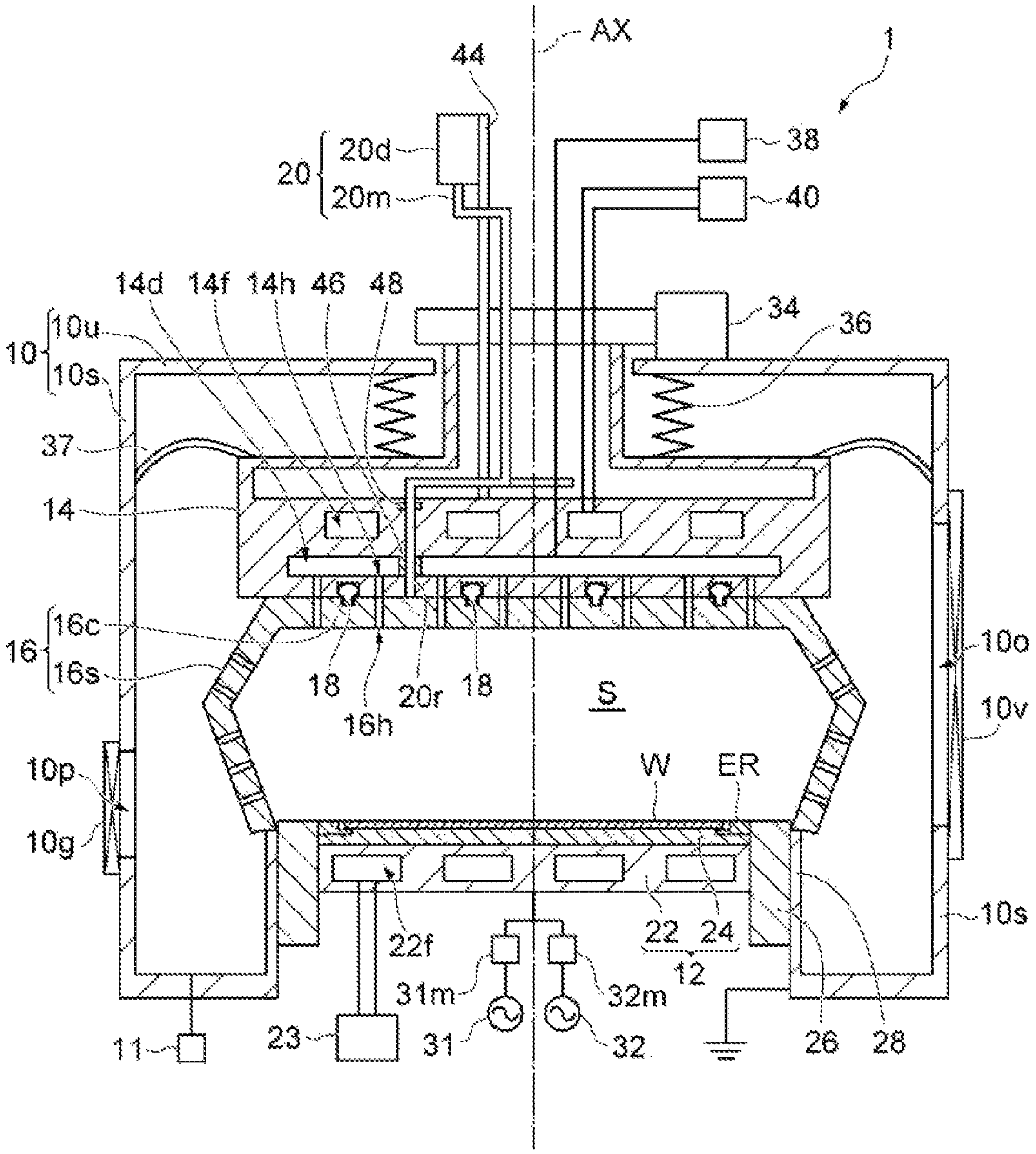
FIG. 2 schematically illustrates a substrate processing apparatus according to one embodiment.
Figure 3:
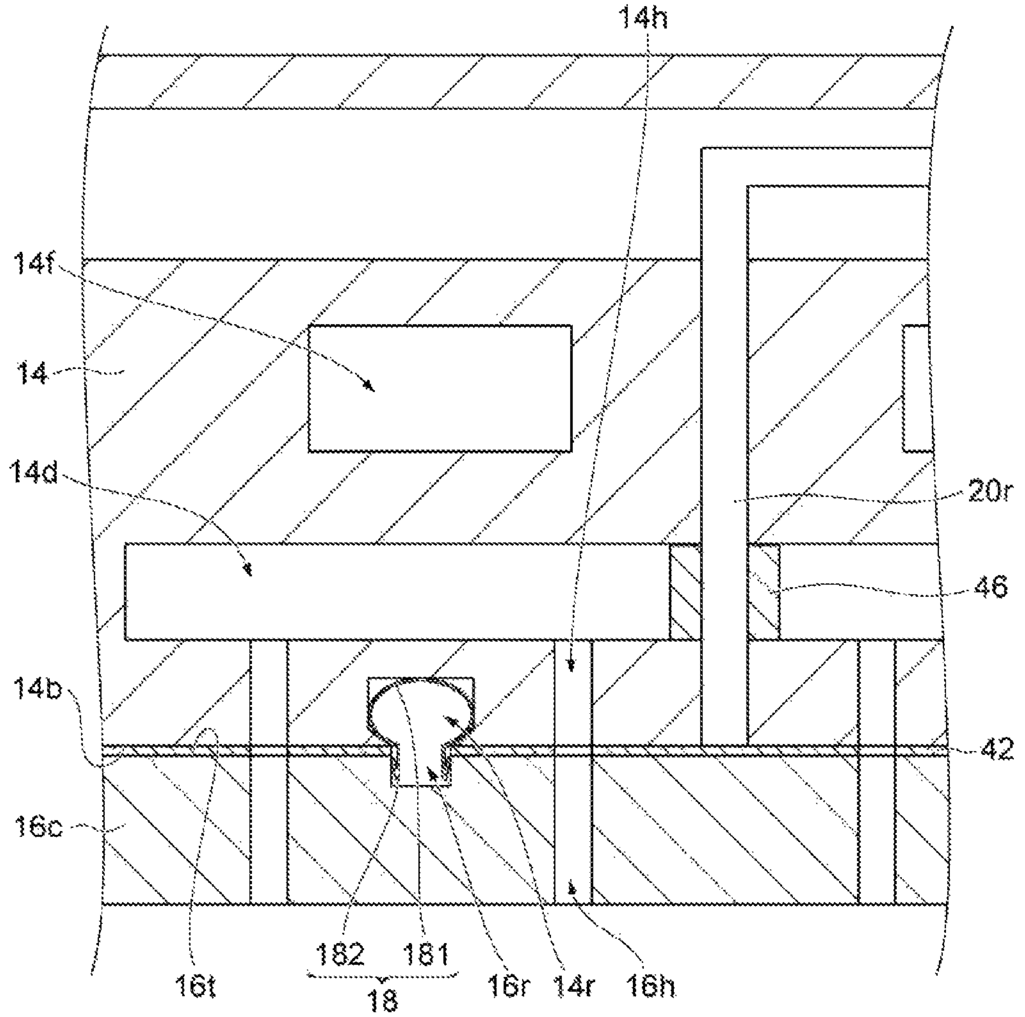
FIG. 3 is a partially enlarged cross-sectional view of a substrate processing apparatus according to one embodiment.
Figure 4:
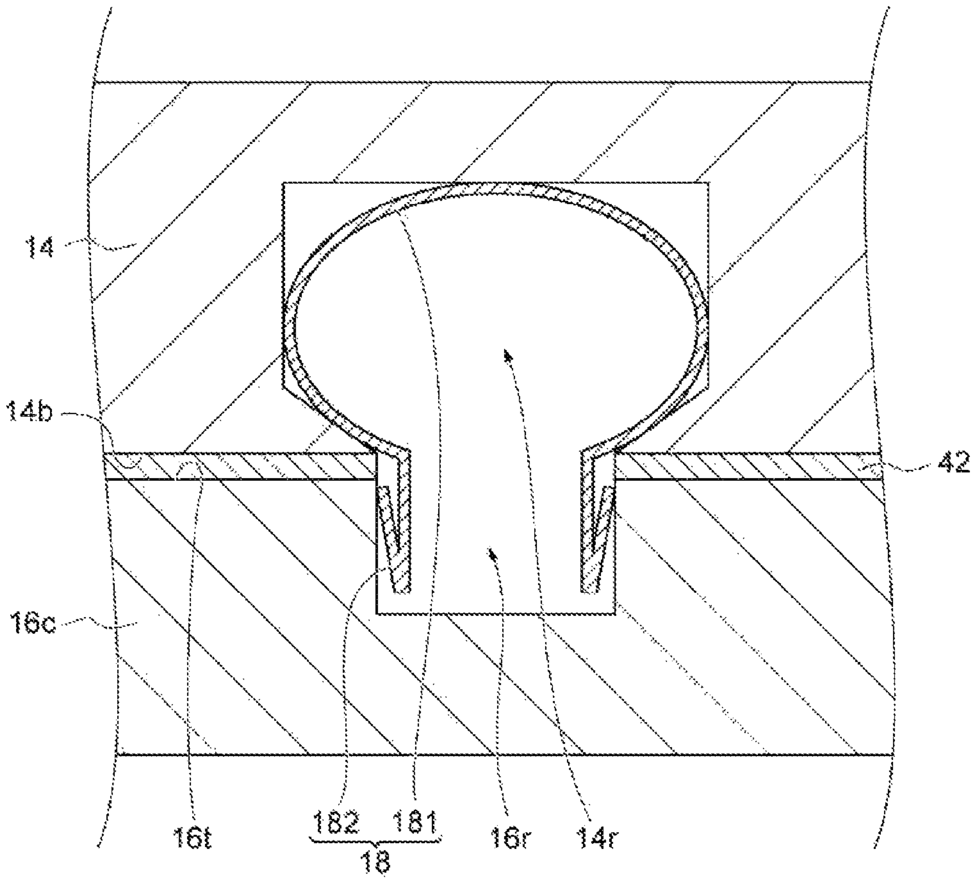
FIG. 4 is a partially enlarged cross-sectional view of a substrate processing apparatus according to one embodiment.

Hereinafter, a substrate processing apparatus according to one embodiment will be described with reference to FIGS. 2 to 4. FIG. 2 schematically shows a substrate processing apparatus according to one embodiment. FIGS. 3 and 4 are partial enlarged cross-sectional views of a substrate processing apparatus according to one embodiment. The substrate processing apparatus 1 shown in FIGS. 2 to 4 can be used as one or more process modules of the substrate processing system PS.

The substrate processing apparatus 1 is a capacitively coupled plasma processing apparatus. The substrate processing apparatus 1 includes a chamber 10, a substrate support 12, a support member 14, an inner wall member 16, one or more contact members 18, and an actuator 20.

The chamber 10 has an inner space therein. The chamber 10 is made of a metal such as aluminum. The chamber 10 is electrically grounded. A corrosion-resistant film may be formed on the surface of the chamber 10. The corrosion-resistant film is made of aluminum oxide or yttrium oxide, for example.

The chamber 10 has a sidewalls 10*s*. The sidewall 10*s* has a substantially cylindrical shape. A central axis of the sidewall 10*s* extends vertically and is indicated by an axis AX in FIG. 2. The sidewall 10*s* has a passage 10*p*. The inner space of the chamber 10 is connected to the inner space of the transfer chamber TC of the transfer module TM through the passage 10*p*. The passage 10*p* can be opened and closed by a gate valve 10*g*. The substrate W is transferred between the inner space of the chamber 10 and the outside of the chamber 10 (i.e., the inner space of the transfer chamber TC) through the passage 10*p*.

The sidewall 10*s* further has an opening 10*o*. The opening 10*o* has a size through which the inner wall member 16 can pass. The inner space of the chamber 10 can be connected to the inner space of the chamber of the transfer module CTM through the opening 10*o*. The opening 10*o* can be opened and closed by a gate valve 10*v*.

The chamber 10 may further has an upper portion 10*u*. The upper portion 10*u* extends from an upper end of the sidewall 10*s* in a direction intersecting the axis AX. The upper portion 10*u* has an opening in an area intersecting the axis AX.

The substrate processing apparatus 1 further includes an exhaust device 11. The exhaust device 11 includes a pressure controller such as an automatic pressure control valve, and a vacuum pump such as a turbo molecular pump. The exhaust device 11 is connected to the inner space of the chamber 10 through a bottom portion of the chamber 10.

The substrate support 12 is disposed in the chamber 10. The substrate support 12 is configured to support a substrate W placed thereon. The substrate support 12 may include a base 22 and an electrostatic chuck 24. The base 22 has a substantially disc shape. A central axis of the base 22 substantially coincides with the axis AX. The base 22 is made of a conductor such as aluminum. The base 22 has a flow path 22*f* therein. The flow path 22*f* extends in a spiral shape, for example. The flow path 22*f* is connected to a chiller unit 23. The chiller unit 23 is disposed outside the chamber 10. The chiller unit 23 supplies a heat medium (e.g., coolant) to the flow path 22*f*. The heat medium supplied to the flow path 22*f* flows through the flow path 22*f* and is returned to the chiller unit 23.

The electrostatic chuck 24 is disposed on the base 22. The electrostatic chuck 24 includes a main body and a chuck electrode. The main body of the electrostatic chuck 24 has a substantially disc shape. A central axis of the electrostatic chuck 24 substantially coincides with the axis AX. The main body of the electrostatic chuck 24 is made of ceramic. The substrate W is placed on an upper surface of the main body of the electrostatic chuck 24. The chuck electrode is made of a conductor. The chuck electrode is disposed in the main body of the electrostatic chuck 24. The chuck electrode is connected to a DC power supply through a switch. When a voltage from the DC power supply is applied to the chuck electrode, an electrostatic attractive force is generated between the electrostatic chuck 24 and the substrate W. The substrate W is attracted and held by the electrostatic chuck 24 due to the electrostatic attractive force thus generated. The substrate processing apparatus 1 may include a gas line for supplying a transfer gas (e.g., helium gas) to a space between the electrostatic chuck 24 and the backside of the substrate W.

The substrate support 12 may further support an edge ring ER placed thereon. The substrate W is placed on the electrostatic chuck 24 in an area surrounded by the edge ring ER. The edge ring ER is made of silicon, quartz, or silicon carbide, for example.

The substrate processing apparatus 1 may further include an insulating portion 26. The insulating portion 26 is made of an insulator such as quartz. The insulating portion 26 may have a substantially tubular shape. The insulating portion 26 extends along an outer periphery of the base 22 and an outer periphery of the electrostatic chuck 24.

The substrate processing apparatus 1 may further include a conductor portion 28. The conductor portion 28 is made of a conductor such as aluminum. The conductor portion 28 may have a substantially tubular shape. The conductor portion 28 extends along an outer peripheral surface of the insulating portion 26. The conductor portion 28 extends in a circumferential direction at a radially outer side of the insulating portion 26. Each of the radial direction and the circumferential direction is defined with respect to the axis AX. The conductor portion 28 is connected to the ground. In one example, the conductor portion 28 is connected to the ground through the chamber 10. The conductor portion 28 may be a part of the chamber 10.

The substrate processing apparatus 1 may further include a radio frequency (RF) power supply 31 and a bias power supply 32. The RF power supply 31 generates a source RF power. The source RF power has a frequency suitable for plasma generation. The frequency of the source high frequency power is 27 MHz or higher, for example. The RF power supply 31 is electrically connected to an electrode in the substrate support 12 through a matching device 31*m*. The RF power supply 31 may be electrically connected to the base 22. The matching device 31*m* has a matching circuit for matching an impedance of a load side of the RF power supply 31 with an output impedance of the RF power supply 31. The RF power supply 31 may be electrically connected to another electrode in the substrate support 12. Alternatively, the RF power supply 31 may be connected to an upper electrode through the matching device 31*m*.

The bias power supply 32 generates electrical bias energy. The electrical bias energy is supplied to the electrode of the substrate support 12 to attract ions from the plasma to the substrate W. The electrical bias energy may be a bias RF power. A waveform of the bias RF power is a sine wave having a bias frequency. The bias frequency is 13.56 MHz or less, for example. In this case, the bias power supply 32 is electrically connected to the electrode of the substrate support 12 through a matching device 32*m*. The bias power supply 32 may be electrically connected to the base 22. The matching device 32*m* has a matching circuit for matching an impedance of a load side of the bias power supply 32 with an output impedance of the bias power supply 32. Alternatively, the bias power supply 32 may be electrically connected to another electrode in the substrate support 12.

Alternatively, the electrical bias energy may be voltage pulses generated periodically at time intervals corresponding to the reciprocal of the above-described bias frequency. The voltage pulse may have a negative polarity. The voltage pulse may be generated by a negative DC voltage.

The support member 14 is disposed above the substrate support 12. The support member 14 is disposed below the upper portion 10*u* of the chamber 10 and at an inner side of the sidewall 10*s*. The support member 14 is vertically movable in the chamber 10.

The substrate processing apparatus 1 may further include a lift mechanism 34. The lift mechanism 34 is configured to move the support member 14 upward and downward. The lift mechanism 34 includes a driving device (e.g., a motor) that generates a power for moving the support member 14. The lift mechanism 34 may be disposed outside the chamber 10 and disposed on or above the upper portion 10*u*.

The substrate processing apparatus 1 may further include a bellows 36. The bellows 36 is disposed between the support member 14 and the upper portion 10*u*. The bellows 36 separates the inner space of the chamber 10 from the outside of the chamber 10. A lower end of the bellows 36 is fixed to the support member 14. An upper end of the bellows 36 is fixed to the upper portion 10*u*.

The support member 14 has a substantially disc shape. The central axis of the support member 14 coincides with the axis AX. The support member 14 is made of a conductor such as aluminum. In one embodiment, the support member 14 may constitute the upper electrode in a capacitively coupled plasma processing apparatus. The support member 14 may be grounded when the RF power supply 31 is electrically connected to the electrode in the substrate support 12. In this case, the support member 14 may be in contact with the inner wall surface of the chamber 10 through a connecting member 37.

In one embodiment, the support member 14 may constitute a shower head together with a ceiling portion (to be described later) of the inner wall member 16. The shower head is configured to supply a gas into the chamber 10 (or a processing space S to be described later). In the present embodiment, the support member 14 has a gas diffusion space 14*d* and a plurality of gas holes 14*h*.

The gas diffusion space 14*d* is disposed in the support member 14. A gas supply device 38 is connected to the gas diffusion space 14*d*. The gas supply device 38 is disposed outside the chamber 10. The gas supply device 38 includes one or more gas sources, one or more flow rate controllers, and one or more valves used in the substrate processing apparatus 1. Each of the one or more sources of gas is connected to gas diffusion space 14*d* via a corresponding flow rate controller and a corresponding valve. The gas holes 14*h* extend downward from the gas diffusion space 14*d*.

In one embodiment, the support member 14 may have a flow path 14*f* therein. The flow path 14*f* is connected to a chiller unit 40. The chiller unit 40 is disposed outside the chamber 10. The chiller unit 40 supplies a heat medium (e.g., a coolant) to the flow path 14*f*. The heat medium supplied to the flow path 14*f* flows through the flow path 14*f* and is returned to the chiller unit 40.

The inner wall member 16 can be transferred between the inside of the chamber 10 and the outside of the chamber 10. The inner wall member 16 may be transferred between the inside of the chamber 10 and the outside of the chamber 10 through the opening 10*o* by the transfer arm CA.

The inner wall member 16 is made of metal such as silicon, silicon carbide, or aluminum. A corrosion-resistant film may be formed on the surface of the inner wall member 16. The corrosion-resistant member is made of aluminum oxide or yttrium oxide, for example.

The inner wall member 16 has a ceiling portion 16*c* that may be disposed above the substrate support 12 and below the support member 14. The ceiling portion 16*c* has a plate shape and has a substantially disc shape. The ceiling portion 16*c* is disposed in the chamber 10 such that the central axis thereof coincides with the axis AX. The ceiling portion 16*c* may be disposed directly below the support member 14 in the chamber 10. Alternatively, the heat transfer sheet 42 may be embedded between a bottom surface of the support member 14 and the ceiling portion 16*c* of the inner wall member 16, as shown in FIG. 3.

As described above, the ceiling portion 16*c* may form the shower head together with the support member 14. In this case, the ceiling portion 16*c* has a plurality of gas holes 16*h*. The gas holes 16*h* penetrate through the ceiling portion 16*c*. The ceiling portion 16*c* is disposed in the chamber 10 such the gas holes 16*h* communicate with the gas holes 14*h*. The gas from the above-described gas supply device 38 is supplied into the chamber 10 (or the processing space S) through the gas diffusion space 14*d*, the gas holes 14*h*, and the gas holes 16*h*.

In one embodiment, the inner wall member 16 may further has a sidewall portion 16*s*. The sidewall portion 16*s* has a substantially tubular shape and extends downward from a peripheral edge of the ceiling portion 16*c*. The sidewall portion 16*s* is disposed in the chamber 10 such that the central axis thereof coincides with the axis AX. The inner wall member 16 may form, together with the substrate support 12, the processing space S in which the substrate W placed on the substrate support 12 is processed. In this case, a lower end of the sidewall portion 16*s* may be in contact with the conductor portion 28.

The sidewall portion 16*s* may have a plurality of through-holes. The through-holes of the sidewall portion 16*s* allow the processing space S to communicate with the space outside the sidewall portion 16*s*. The gas in the processing space S is exhausted by the exhaust device 11 through the through-holes of the sidewall portion 16*s* and the space outside the sidewall portion 16*s*.

Figure 5:
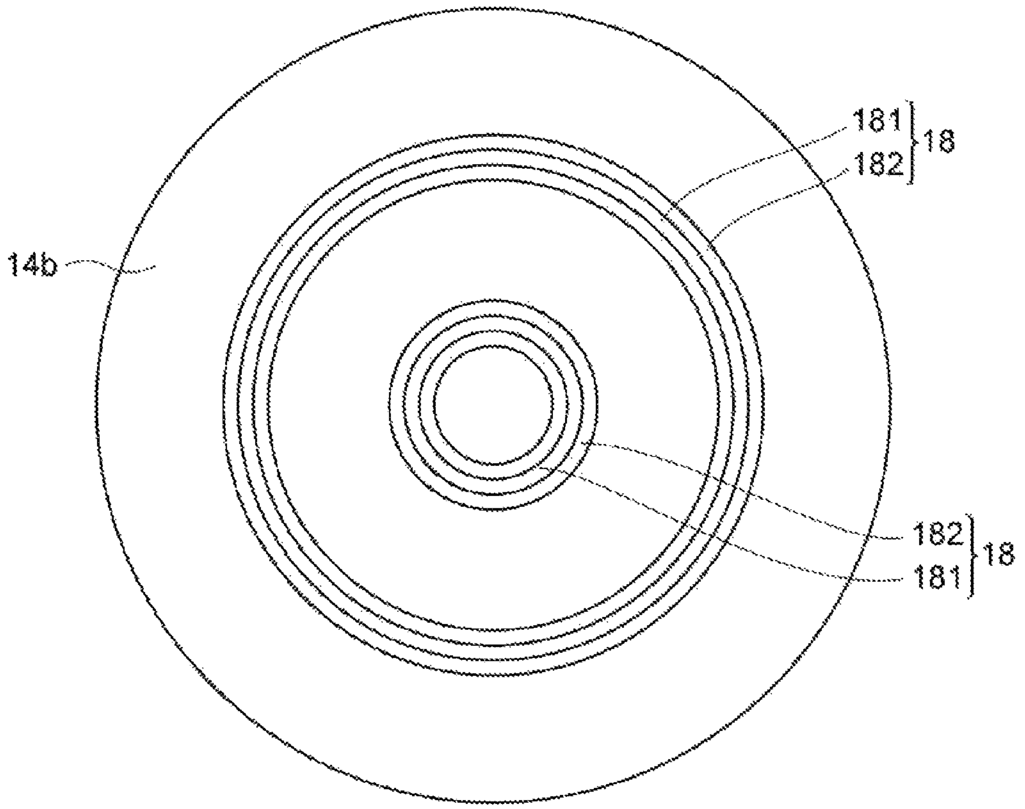
FIG. 5 is a plan view showing a contact member in a substrate processing apparatus according to one embodiment.
Figure 6:
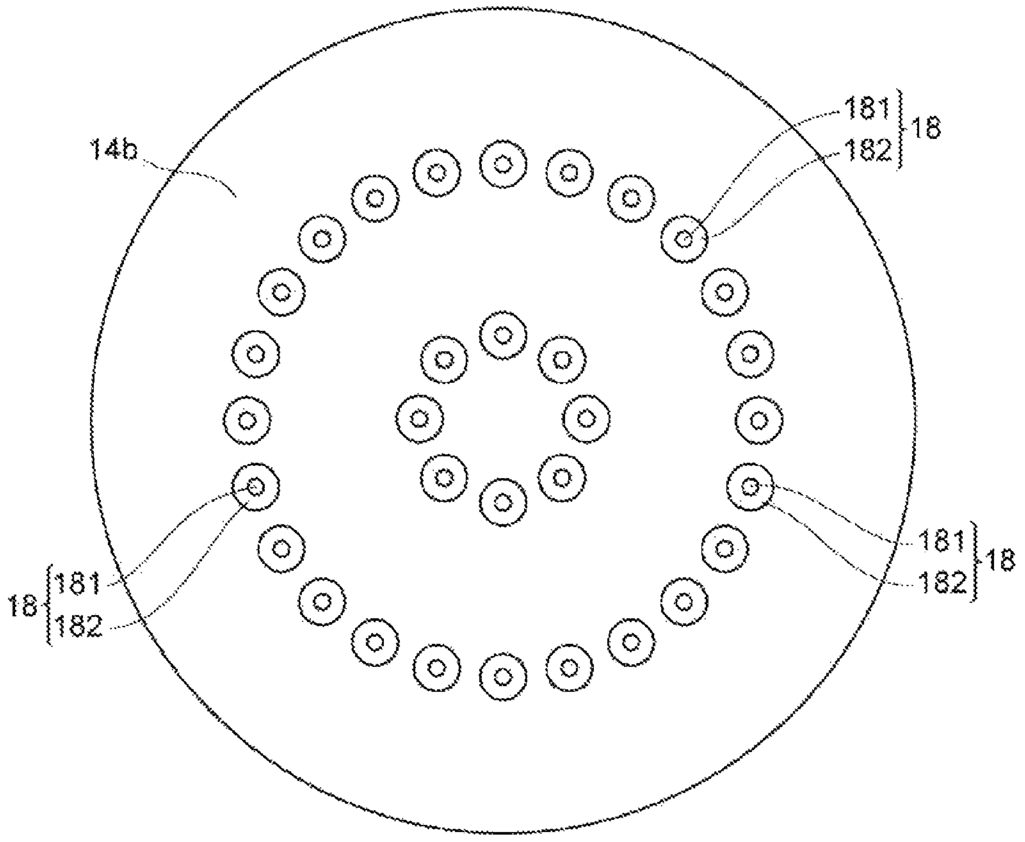
FIG. 6 is a plan view showing another contact member in a substrate processing apparatus according to one embodiment.

Hereinafter, FIGS. 5 and 6 will be referred to together with FIGS. 2 to 4. FIG. 5 is a plan view showing a contact member in a substrate processing apparatus according to one embodiment. FIG. 6 is a plan view showing another contact member in a substrate processing apparatus according to one embodiment. The substrate processing apparatus 1 may include a plurality of contact members 18 as one or more contact members.

The contact members 18 may be made of a conductor such as a metal or the like. The contact members 18 are attached to one of the support member 14 and the inner wall member 16. When one of the support member 14 and the inner wall member 16 is combined with the other member, each of the contact members 18 is horizontally deformed by the other member, thereby applying a spring reaction force to the other member in a horizontal direction. Accordingly, the contact members 18 detachably fix the inner wall member 16 to the support member 14.

In the embodiment shown in FIGS. 2 to 4, the contact members 18 are attached to the support member 14. When the inner wall member 16 is combined with the support member 14, the contact members 18 are deformed in the horizontal direction by the inner wall member 16, thereby applying a spring reaction force to the inner wall member 16 in the horizontal direction. Accordingly, the contact members 18 detachably fix the inner wall member 16 to the support member 14.

In one embodiment, a bottom surface 14*b* of the support member 14 may have a plurality of recesses 14*r*. The recesses 14*r* are opened downward. Further, an upper surface 16*t* of the ceiling portion 16*c* may have a plurality of recesses 16*r*. The recesses 16*r* are opened upward. Each of the contact members 18 may have a first portion 181 and a second portion 182. The first portion 181 is fitted into the corresponding recess 14*r* of the support member 14. The second portion 182 extends downwardly from the first portion 181, and has a spring. The spring of the second portion 182 is fitted into the corresponding recess 16*r* of the ceiling portion 16*c*, and applies a spring reaction force.

In one embodiment, the contact members 18 may be configured to be detachable from the support member 14. The first portion 181 has elasticity so that it can be deformed in the horizontal direction and extracted from the corresponding recess 14*r* when the contact member 18 is separated from the support member 14. In one embodiment, each of the recesses 14*r* of the support member 14 may be narrowed at the lower opening thereof.

In one embodiment, the first portion 181 may have an arc shape in any cross section including the axis AX, and may have a hollow inner space. Further, the first portion 181 may be opened at the lower end thereof. The first portion 181 has elasticity in the horizontal direction. The first portion 181 that is horizontally contracted passes through the lower end opening of each of the recesses 14*r* and is extracted from the corresponding recess 14*r*.

In one embodiment, the second portion 182 extends downward from the lower end of the first portion 181, and may extend obliquely upward from the lower end thereof to provide a flat spring. The second portion 182 may have an opening at the lower end thereof. When the second portion 182 is fitted into the corresponding recess 16*r* of the ceiling portion 16*c*, the second portion 182 is horizontally contracted by the wall surface that defines the recess 16*r*, thereby applying a spring reaction force to the wall surface. Accordingly, the contact member 18 detachably fixes the inner wall member 16 to the support member 14.

In one embodiment, as shown in FIG. 5, the contact members 18 may have an annular shape extending in the circumferential direction. In the present embodiment, the recesses 14*r* and 16*r* also have an annular shape extending in the circumferential direction. Further, in the present embodiment, in a state where the inner wall member 16 is fixed to the support member 14 in the chamber 10, the contact members 18 and the recesses 14*r* and 16*r* extend in the circumferential direction about the axis AX.

In another embodiment, the contact members 18 may be arranged along one circle or multiple concentric circles, as shown in FIG. 6. In the present embodiment, the recesses 14*r* and 16*r* are also arranged along one circle or multiple concentric circles. In the present embodiment, when the inner wall member 16 is fixed to the support member 14 in the chamber 10, the contact members 18 and the recesses 14*r* and 16*r* are arranged along the circumferential direction about the axis AX.

Referring back to FIGS. 2 to 4, the actuator 20 is configured to move the inner wall member 16 downward to release the fixing of the inner wall member 16 to the support member 14. In one embodiment, the actuator 20 includes a driving device 20*d*. The actuator 20 may include a plurality of rods 20*r*.

The driving device 20*d* is disposed outside the chamber 10. The driving device 20*d* generates a power for vertically moving a driving shaft 20*m*. The driving device 20*d* may include a power cylinder such as an air cylinder, or a motor. The driving device 20*d* is fixed to the support member 44 outside the chamber 10.

The rods 20*r* are coupled to the driving shaft 20*m*. The rods 20*r* extend downward from the driving shaft 20*m*. The rods 20*r* are arranged along the circumferential direction about the axis AX. The rods 20*r* may be arranged at regular intervals.

The support member 14 has a plurality of through-holes extending in the vertical direction. The through-holes penetrate through the support member 14 from the upper surface to the bottom surface thereof through the gas diffusion space 14*d*. The rods 20*r* are inserted into the through-holes of the support member 14. A sealing member 48 such as an O-ring is disposed between the support member 14 and each of the rods 20*r*. The rods 20*r* pass through a tubular member 46 in the gas diffusion space 14*d*.

The rods 20*r* are moved up and down by the driving device 20*d*. When the inner wall member 16 is fixed to the support member 14, the rods 20*r* are arranged such that the lower ends thereof are positioned at the same horizontal level as the upper surface 16*t* of the ceiling portion 16*c* of the inner wall member 16 or positioned above the top surface 16*t*. When the inner wall member 16 is removed from the support member 14, the rods 20*r* are moved by the driving device 20*d* such that the inner wall member 16 is moved downward in a state where the lower ends of the rods 20*r* are in contact with the upper surface 16*t* of the ceiling portion 16*c* of the inner wall member 16.

In accordance with the substrate processing apparatus 1, the contact members 18 are deformed by the inner wall member 16, thereby applying a spring reaction force to the inner wall member 16 in the horizontal direction. Accordingly, the inner wall member 16 is fixed to the support member 14. Further, the fixing of the inner wall member 16 to the support member 14 is easily released by moving the inner wall member 16 downward using the actuator 20 against the spring reaction force of the contact members 18. The inner wall member 16 released from the support member 14 can be unloaded from the chamber 10 to the outside through the opening 10*o* of the sidewall 10*s* of the chamber 10. Therefore, in accordance with the substrate processing apparatus 1, the maintenance of the inner wall member 16 can be easily performed.

The substrate processing apparatus 1 may include one contact member 18. In this case, the number of the recess 14*r* and the number of the recess 16 is one.

Hereinafter, a maintenance method for a substrate processing apparatus according to one embodiment will be described with reference to FIGS. 7 to 12. FIGS. 7 to 12 show the state of the substrate processing apparatus while a maintenance method according to one embodiment is being performed. In the maintenance method, the individual components of the substrate processing system PS is controlled by controller MC.

Figure 7:
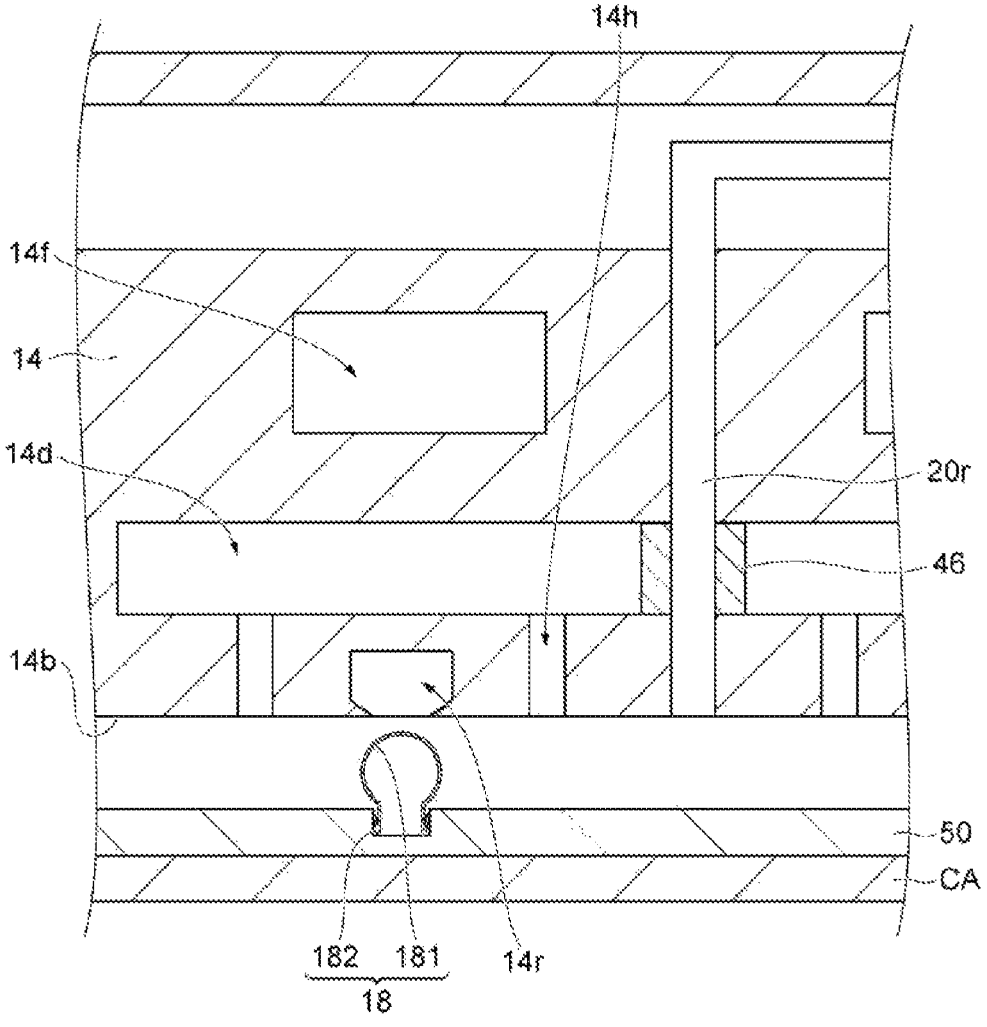
FIGS. 7 to 12 show a state of a substrate processing apparatus while a maintenance method according to one embodiment is being performed.

In the maintenance method, the contact members 18 are attached to one of the support member 14 and the inner wall member 16. In the case of applying the maintenance method to the substrate processing apparatus 1, the contact members 18 are attached to the support member 14. Specifically, as shown in FIG. 7, a base 50 is loaded into the chamber 10 from the outside of the chamber 10 by the transfer arm CA. The base 50 has a plurality of recesses on an upper surface thereof. The second portions 182 of the contact members 18 are fitted into the recesses of the base 50. The base 50 is loaded into the chamber 10 such that the contact members 18 are positioned below the recesses 14*r* of the support member 14, respectively.

Figure 8:
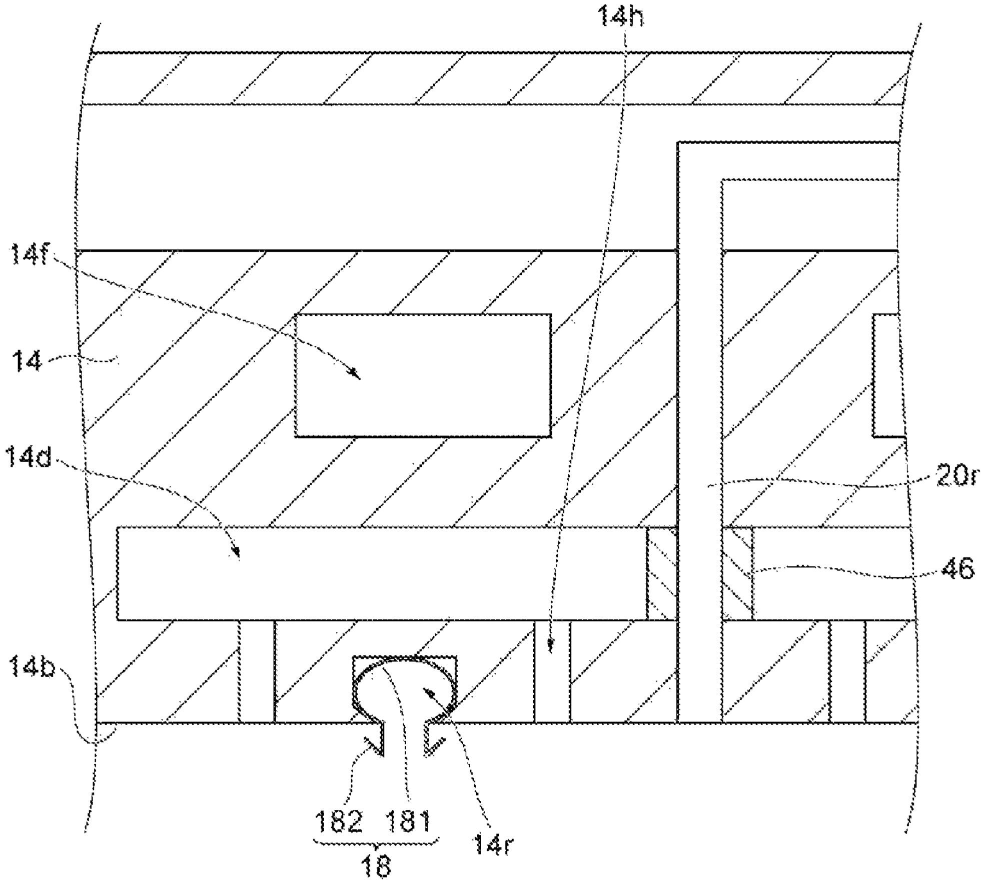

Next, the transfer arm CA is moved upward, or the support member 14 is moved downward by the lift mechanism 34. Accordingly, as shown in FIG. 8, the first portions 181 of the contact members 18 are fitted into the recesses 14*r* of the support member 14, so that the contact members 18 are attached to the support member 14. Then, the transfer arm CA retracts from the chamber 10 to the outside.

Figure 9:
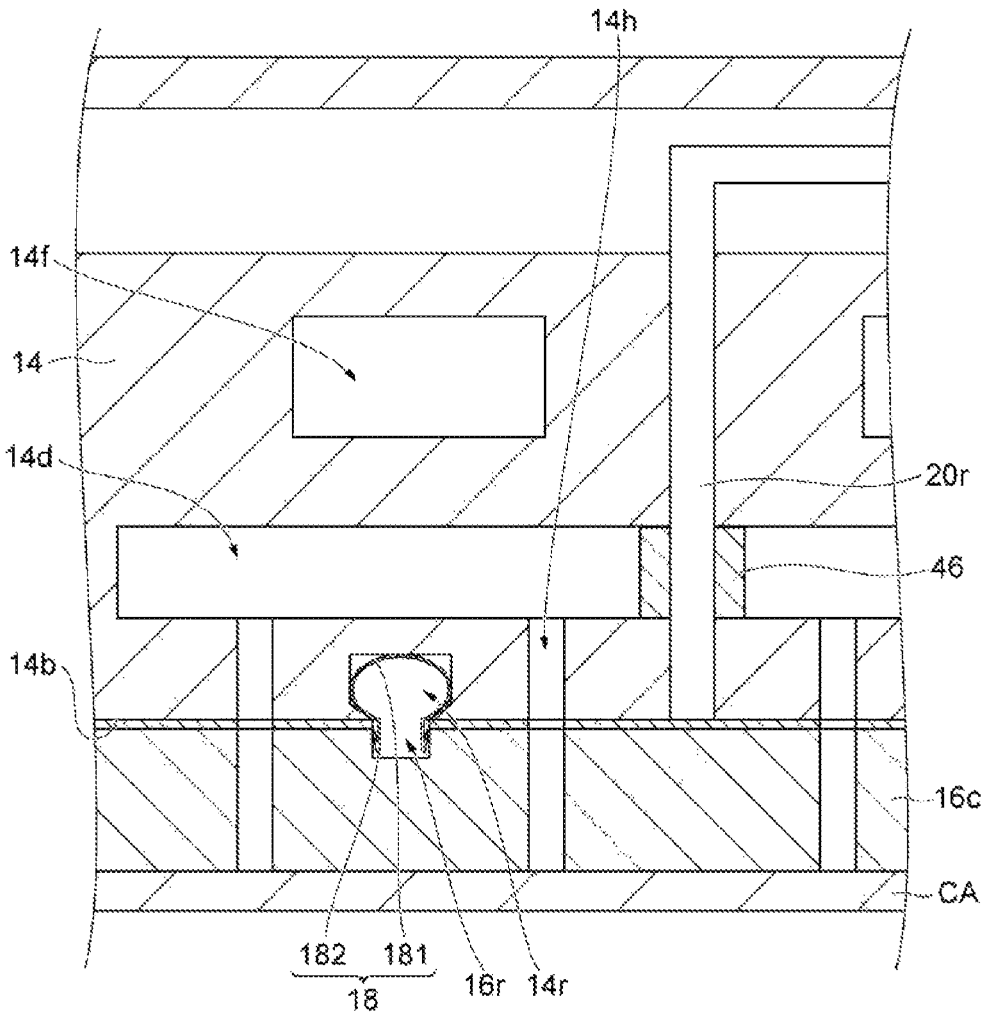

Next, the inner wall member 16 is loaded into the chamber 10 from the outside of the chamber 10 through the opening 10*o* by the transfer arm CA. Thereafter, the support member 14 or the inner wall member 16 is moved in the vertical direction. In other words, the support member 14 is moved downward by the lift mechanism 34, or the inner wall member 16 is moved upward by the transfer arm CA. Accordingly, the inner wall member 16 is detachably fixed to the support member 14, as shown in FIG. 9.

The contact members 18 are horizontally deformed by the other member between the support member 14 and the inner wall member 16, thereby applying a spring reaction force to the other member. In the substrate processing apparatus 1, the other member is the inner wall member 16. Specifically, the second portions 182 of the contact members 18 are fitted into the corresponding recesses 16*r* and contracted in the horizontal direction, thereby applying a spring reaction force to the wall surface that defines the corresponding recesses 16*r*. Accordingly, the inner wall member 16 is fixed to the support member 14. After the inner wall member 16 is fixed to the support member 14, the transfer arm CA retracts from the chamber 10 to the outside.

In the maintenance method, the inner wall member 16 is unloaded from the chamber 10 to the outside of the chamber 10 for its maintenance (e.g., replacement). Therefore, the transfer arm CA enters the chamber 10 from the outside of the chamber 10 through the opening 10*o*.

Figure 10:
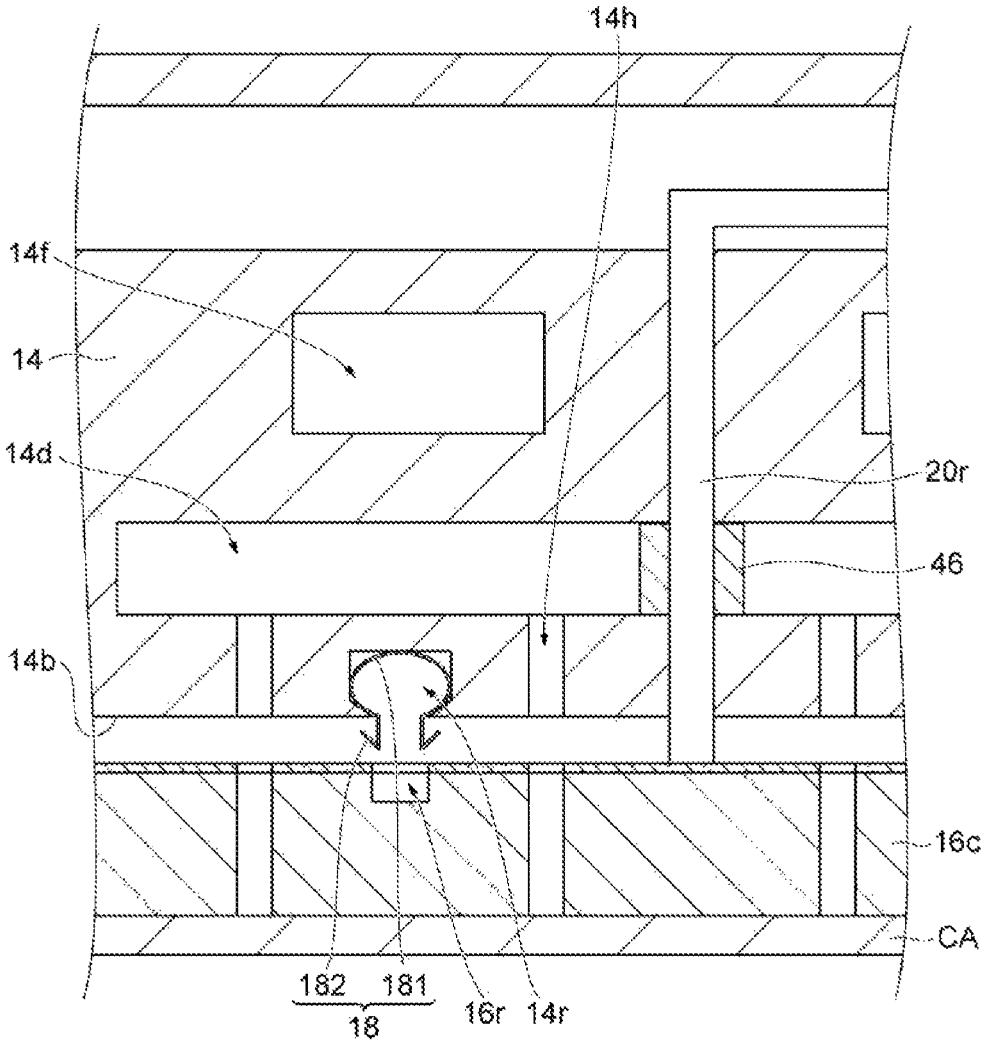

Then, the inner wall member 16 is moved downward against the spring reaction force of the contact members 18 by the actuator 20. Accordingly, the fixing of the inner wall member 16 by the contact members 18 is released. The inner wall member 16 that has moved downward is transferred to the transfer arm CA as shown in FIG. 10. Next, the inner wall member 16 is unloaded from the chamber 10 to the outside of the chamber 10 through the opening 10*o* by the transfer arm CA.

Figure 11:
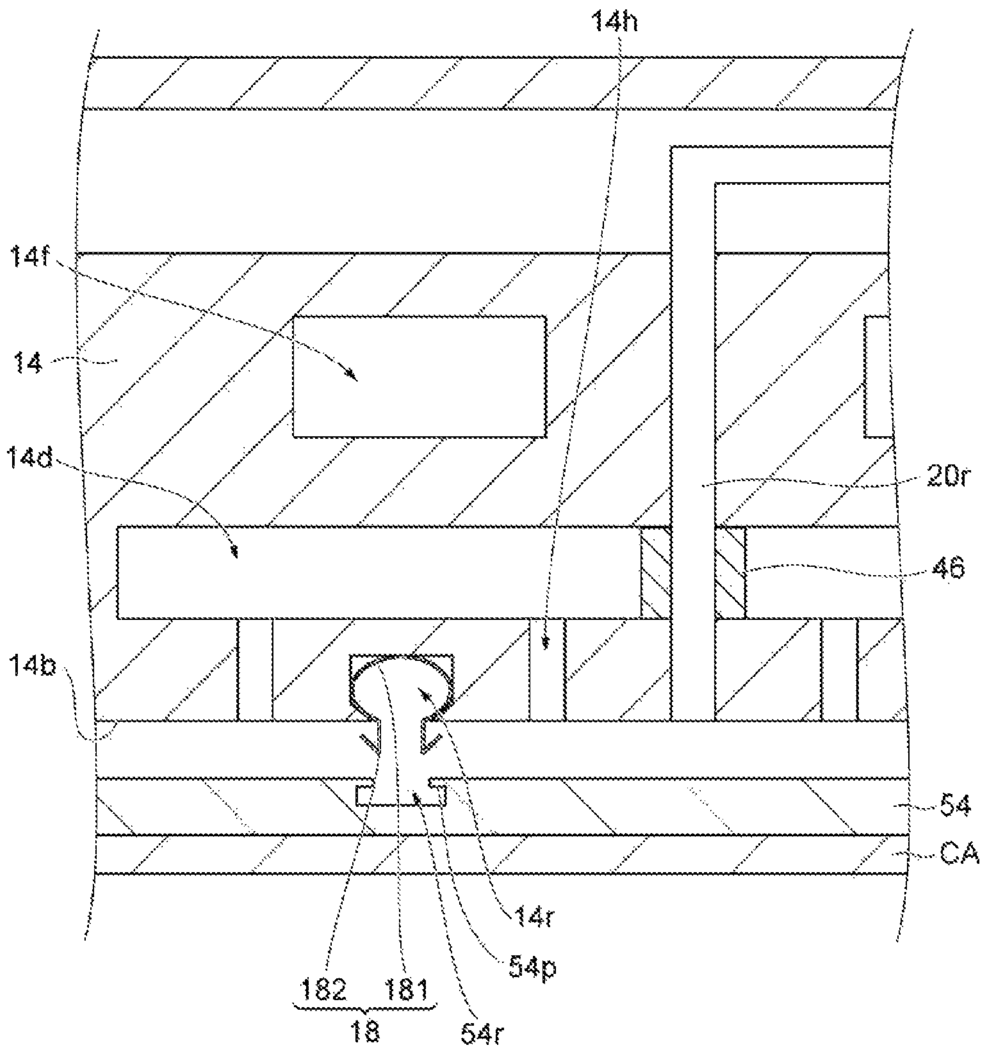

In the maintenance method, the contact members 18 may be separated for maintenance (e.g., replacement) thereof. Therefore, as shown in FIG. 11, the base 54 is loaded into the chamber 10 from the outside of the chamber 10 through the opening 10*o* by the transfer arm CA. The base 54 has a plurality of recesses 54*r* on an upper surface thereof. Each of the recesses 54*r* is narrowed by a protruding portion 54*p* at the upper opening thereof. The base 54 is disposed such that the recesses 54*r* are disposed below the contact members 18.

Figure 12:
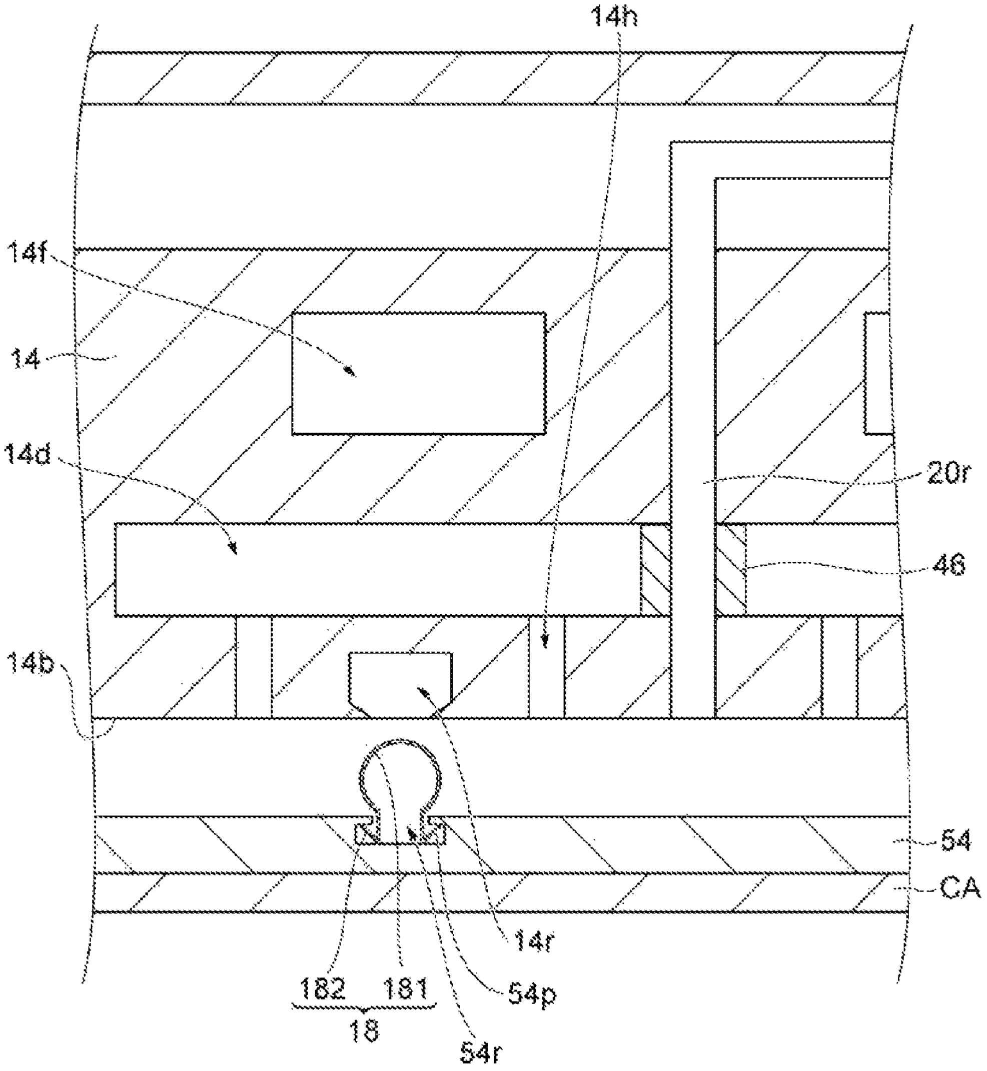

Next, the transfer arm CA is moved upward, or the support member 14 is moved downward by the lift mechanism 34. Accordingly, the second portions 182 of the contact members 18 are fitted into the corresponding recesses 54*r*. The second portions 182 of the contact members 18 pass through the upper openings of the corresponding recesses 54*r*, and then expand to have a width greater than the widths of the upper openings. Next, the transfer arm CA is moved downward, or the support member 14 is moved upward by the lift mechanism 34. As a result, the contact members 18 are separated from the support member 14 and transferred to the base 54, as shown in FIG. 12. Then, the contact members 18 are unloaded from the chamber 10 to the outside of the chamber 10 by the transfer arm CA.

Figure 13:
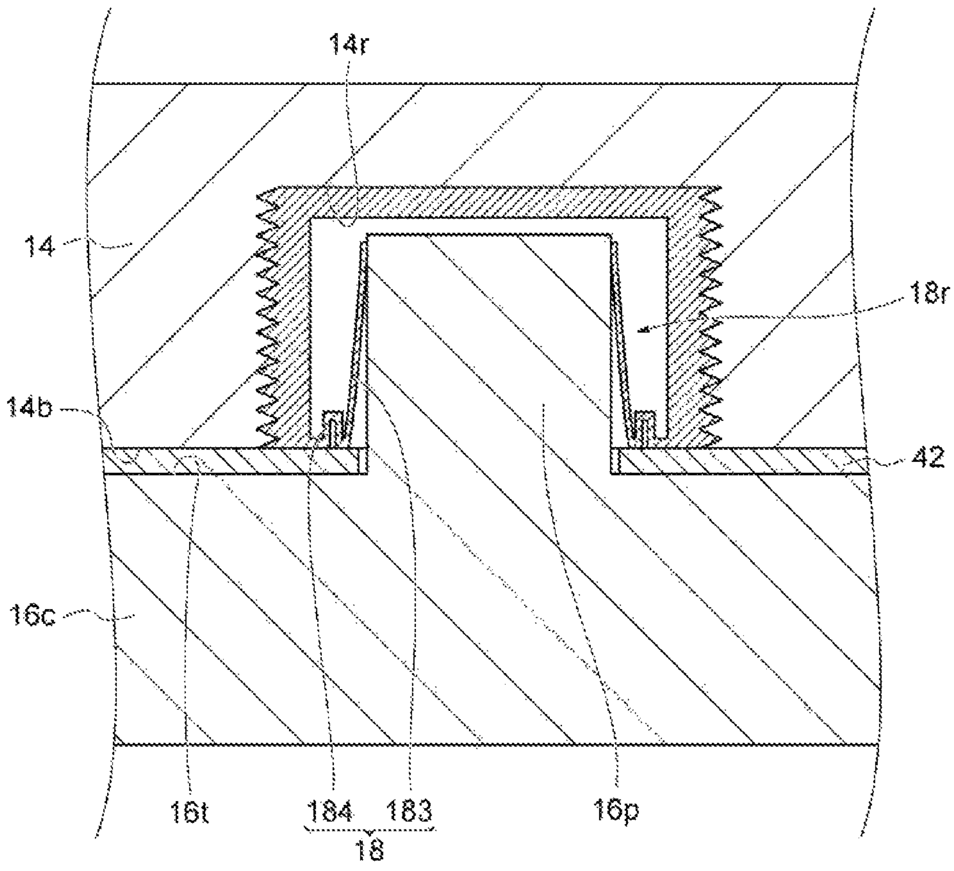
FIG. 13 is a partially enlarged cross-sectional view of a support member, an inner wall member, and a contact member according to another embodiment.

Hereinafter, a support member, an inner wall member, and a contact member according to another embodiment will be described with reference to FIG. 13. FIG. 13 is an enlarged partial cross-sectional view of a support member, an inner wall member, and a contact member according to another embodiment. The support member, the inner wall member, and the contact member of the embodiment shown in FIG. 13 can be adopted in the substrate processing apparatus 1.

In the embodiment shown in FIG. 13, the upper surface 16*t* of the ceiling portion 16*c* has a plurality of protrusions 16*p*. The protrusions 16*p* protrude upward compared to other portions of the upper surface 16*t* of the ceiling portion 16*c*. Further, in the embodiment shown in FIG. 13, the bottom surface 14*b* of the support member 14 has the recesses 14*r*. The recesses 14*r* are opened downward.

In the embodiment shown in FIG. 13, the contact members 18 may be made of a conductor such as a metal or the like. The contact members 18 are fixed in the recesses 14*r*. The wall surface of the support member 14 that defines the recesses 14*r* may have a female screw. An outer peripheral surface of each of the contact members 18 may have a male screw. Each of the contact members 18 is screwed into the female screw in the corresponding recess 14*r* and fixed in the corresponding recess 14*r*.

Each of the contact members 18 has a recess 18*r* that is opened downward. Each of the contact members 18 includes a spring 183. The spring 183 is disposed in the recess 18*r*. A lower end of the spring 183 is directly or indirectly fixed to a wall surface that defines the recess 18*r* so that the spring 183 can be horizontally deformed. When the corresponding protrusion 16*p* is fitted into the recess 18*r*, the spring 183 is deformed in the horizontal direction, thereby applying a spring reaction force to the protrusion 16*p* in the horizontal direction. Accordingly, the inner wall member 16 is fixed to the support member 14. Also in the embodiment shown in FIG. 13, when the inner wall member 16 is moved downward by the actuator 20, the fixing of the inner wall member 16 to the support member 14 is easily released.

As shown in FIG. 13, the spring 183 may be fixed to the wall surface that defines the recess 18*r* by a floating mechanism 184. The floating mechanism 184 absorbs displacement of the protrusion 16*p* in the horizontal direction.

Figure 14:
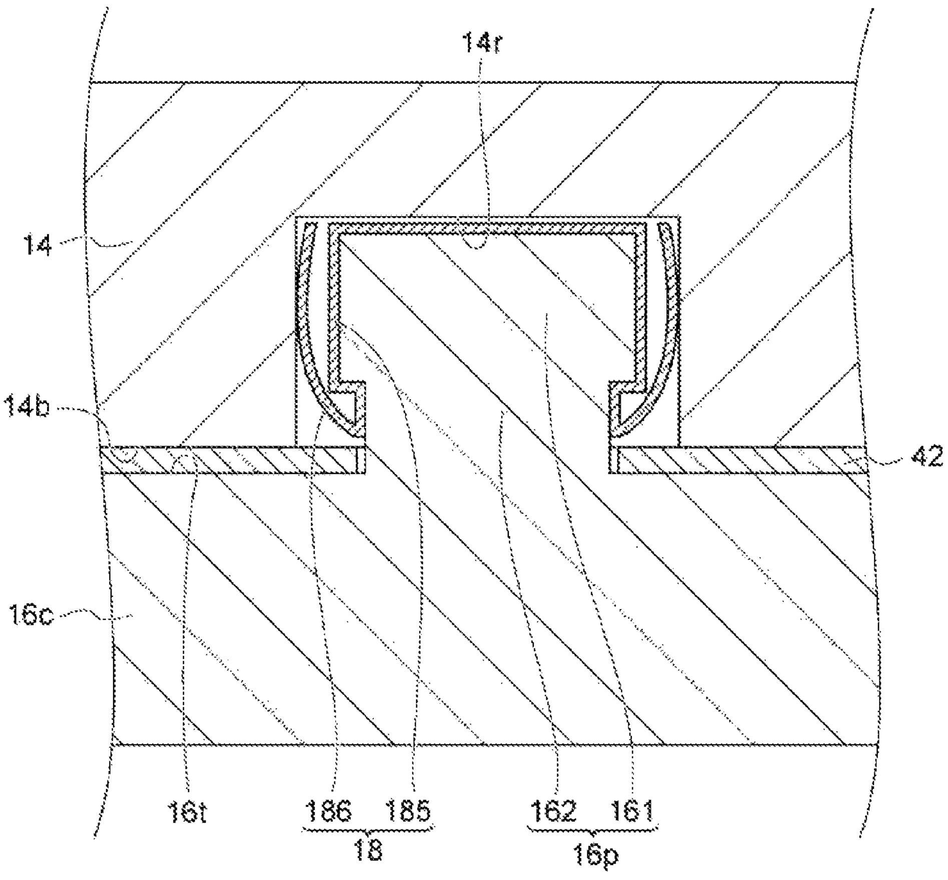
FIG. 14 is a partially enlarged cross-sectional view of a support member, an inner wall member, and a contact member according to still another embodiment.

Hereinafter, a support member, an inner wall member, and a contact member according to still another embodiment will be described with reference to FIG. 14. FIG. 14 is an enlarged partial cross-sectional view of a support member, an inner wall member, and a contact member according to still another embodiment. The support member, the inner wall member, and the contact member of the embodiment shown in FIG. 14 can be adopted in the substrate processing apparatus 1.

In the embodiment shown in FIG. 14, the bottom surface 14*b* of the support member 14 has the recesses 14*r*. The recesses 14*r* are opened downward. In the embodiment shown in FIG. 14, the upper surface of the ceiling portion 16*c* has the protrusions 16*p*. Each of the protrusions 16*p* may have an upper portion 161 and a lower portion 162. The upper portion 161 is disposed above the lower portion 162. The width of the upper portion 161 may be greater than the width of the lower portion 162.

In the embodiment shown in FIG. 14, the contact members 18 may be made of a conductor such as a metal or the like. The contact members 18 are fixed to the ceiling portion 16*c* to cover the corresponding protrusions 16*p*. Each of the contact members 18 includes a cover portion 185. The cover portion 185 has a cavity opened at the lower end thereof. The cover portion 185 covers the corresponding protrusion 16*p* disposed in the cavity. The wall surface of the cover portion 185 that defines the cavity is in contact with outer surfaces of the upper portion 161 and the lower portion 162 of the corresponding protrusion 16*p*. When the cover portion 185 is attached to the corresponding protrusion 16*p*, the cover portion 185 covers the corresponding protrusion 16*p* in a state where the lower opening thereof is expanded.

Each of the contact members 18 further includes a spring 186. The spring 186 is disposed on the side of the cover portion 185. A lower end of the spring 186 is fixed to a lower end of the cover portion 185. The spring 186 extends upward from the lower end of the cover portion 185 to be deformable in the horizontal direction. When the contact members 18 and the corresponding protrusions 16*p* are fitted into the corresponding recesses 14*r*, the springs 186 are deformed in the horizontal direction and apply a spring reaction force to the support member 14 in the horizontal direction. Accordingly, the inner wall member 16 is fixed to the support member 14. Also in the embodiment shown in FIG. 14, when the inner wall member 16 is moved downward by the actuator 20, the fixing of the inner wall member 16 to the support member 14 is easily released.

Figure 15:
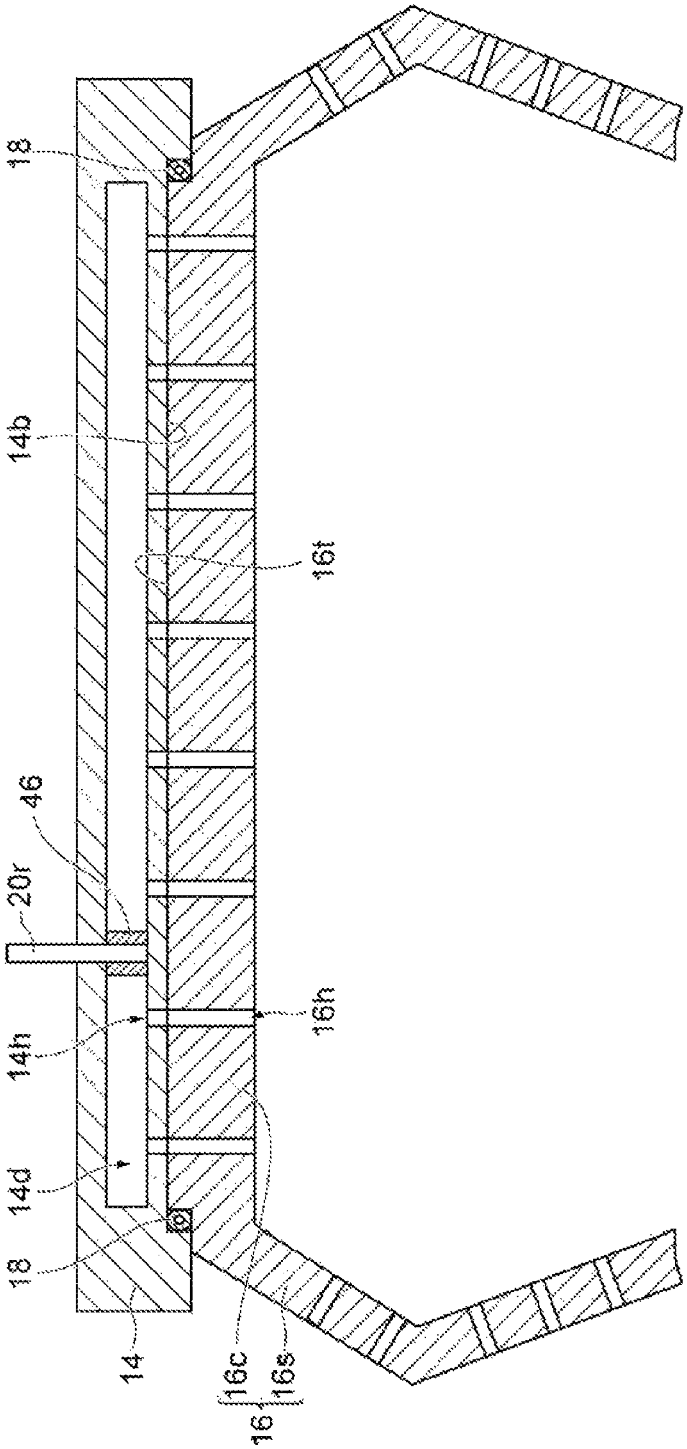
FIG. 15 is a partially enlarged cross-sectional view of a support member, an inner wall member, and a contact member according to further still another embodiment.

Hereinafter, a support member, an inner wall member, and a contact member according to further still another embodiment will be described with reference to FIG. 15. FIG. 15 is an enlarged partial cross-sectional view of a support member, an inner wall member, and a contact member according to further still another embodiment. The support member, the inner wall member, and the contact member of the embodiment shown in FIG. 15 can be adopted in the substrate processing apparatus 1.

In the embodiment shown in FIG. 15, the bottom surface 14*b* of the support member 14 has one recess. The recess on the bottom surface 14*b* of the support member 14 is substantially circular in plan view. In the embodiment shown in FIG. 15, the upper surface 16*t* of the ceiling portion 16*c* has one protrusion. The protrusion on the upper surface 16*t* of the ceiling portion 16*c* is substantially circular in plan view.

In the embodiment shown in FIG. 15, the contact member 18 is a spiral spring gasket. In the embodiment shown in FIG. 15, the contact member 18 may be made of a conductor such as a metal or the like. The contact member 18 is disposed to extend in the circumferential direction along the inner wall surface that defines the recess of the support member 14. The contact member 18, i.e., the spiral spring gasket, is embedded between an outer peripheral surface of the protrusion of the ceiling portion 16*c* and the inner wall surface that defines the recess of the support member 14 when the protrusion of the ceiling portion 16*c* is fitted into the recess of the support member 14. Accordingly, the contact member 18 is deformed in the horizontal direction and applies a spring reaction force to the inner wall member 16, i.e., the outer peripheral surface of the protrusion of the ceiling portion 16*c*. Hence, the inner wall member 16 is fixed to the support member 14. Also in the embodiment shown in FIG. 15, when the inner wall member 16 is moved downward by the actuator 20, the fixing of the inner wall member 16 to the support member 14 is easily released.

Figure 16:
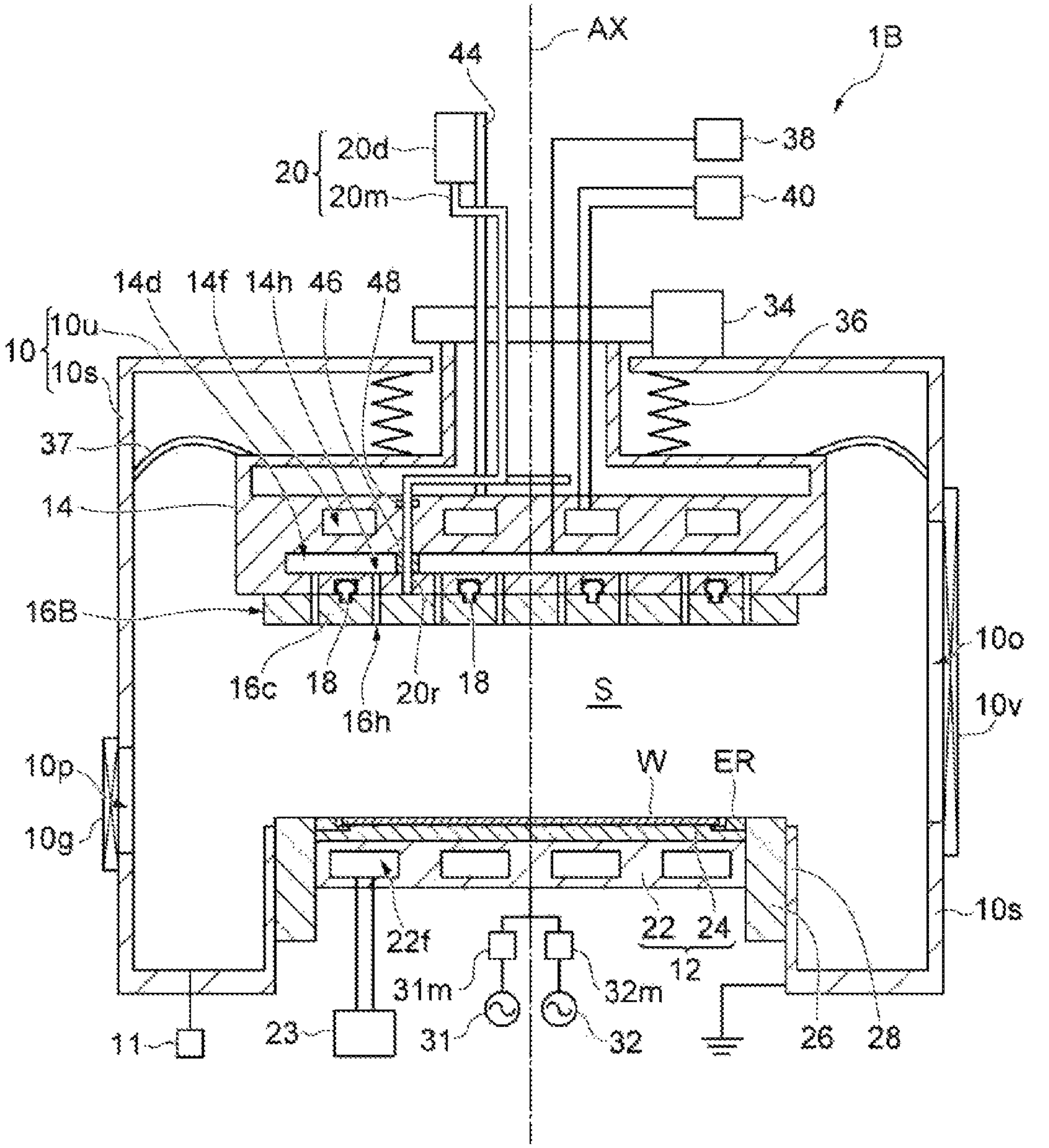
FIG. 16 schematically shows a substrate processing apparatus according to another embodiment.

Hereinafter, a substrate processing apparatus according to another embodiment will be described with reference to FIG. 16. FIG. 16 schematically illustrates a substrate processing apparatus according to another embodiment. A substrate processing apparatus 1B shown in FIG. 16 is different from the substrate processing apparatus 1 in that it includes an inner wall member 16B instead of the inner wall member 16. The inner wall member 16B has a ceiling portion 16*c* similarly to the inner wall member 16, but does not have a sidewall portion 16*s*. Other configurations of the substrate processing apparatus 1B are the same as those of the substrate processing apparatus 1B.

Hereinafter, substrate processing apparatuses according to other embodiments will be described. Each of the embodiments to be described below includes a contact mechanism that electrically connects the inner wall member 16 to the grounded conductor portion 28. The inner wall member 16 is made of a conductive material. The conductor portion 28 has a tubular shape and extends along an outer circumference of the substrate support 12. The contact mechanism electrically connects a lower end 16*e* of the sidewall portion 16*s* of the inner wall member 16 to the conductor portion 28.

Figure 17:
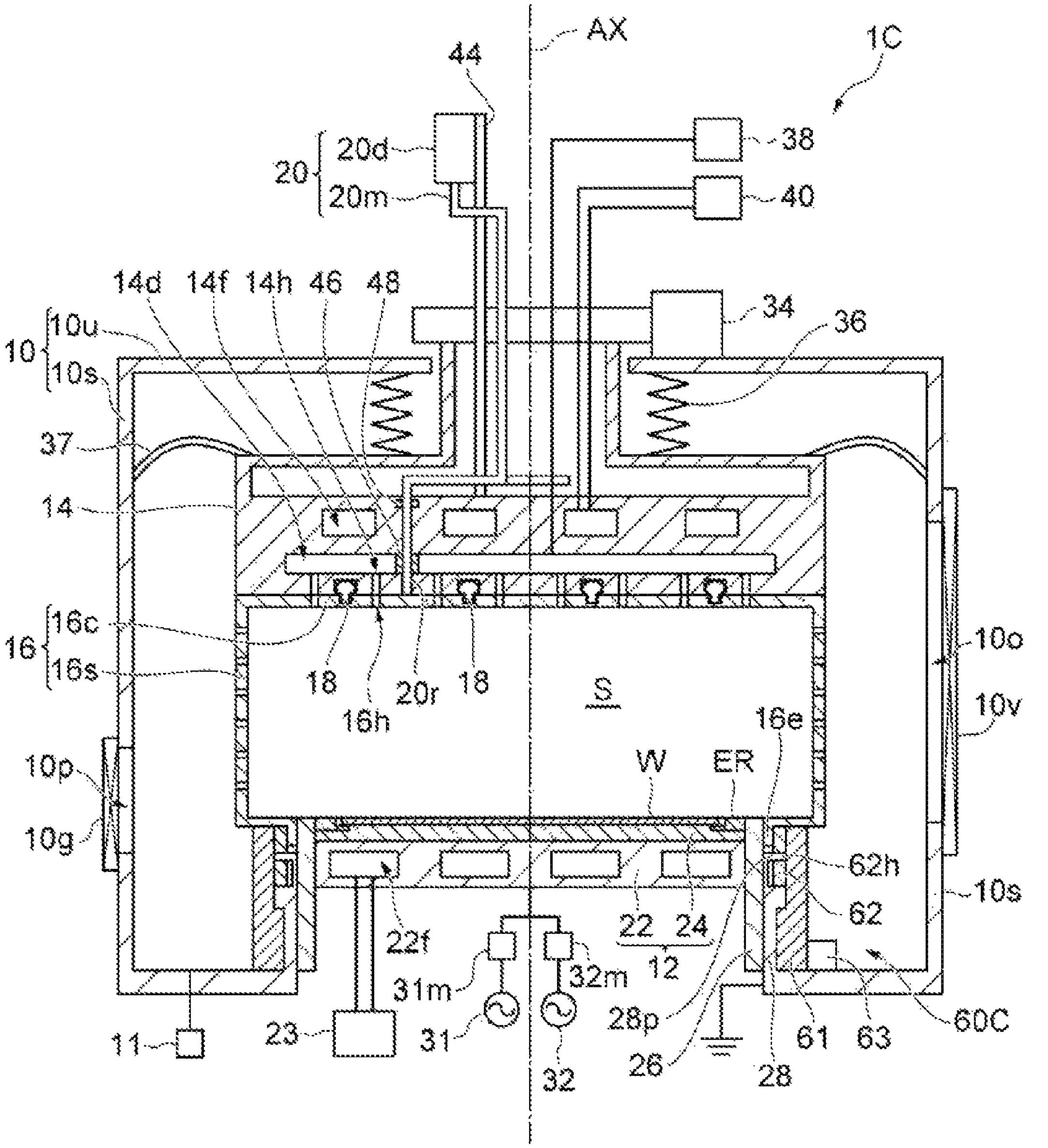
FIG. 17 schematically shows a substrate processing apparatus according to still another embodiment.
Figure 18B:
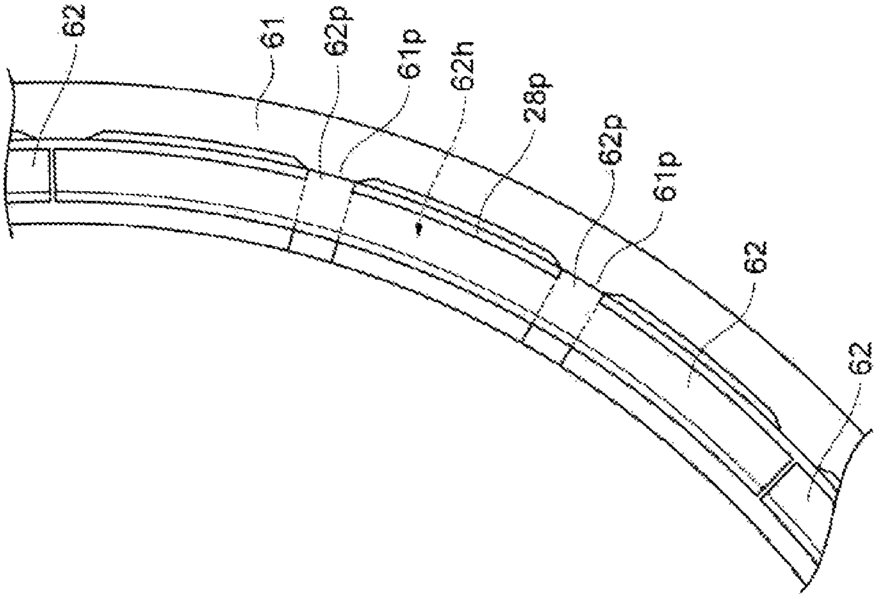
FIGS. 18A and 18B are partially enlarged plan views of a contact mechanism in a substrate processing apparatus according to further still another embodiment.
Figure 18A:
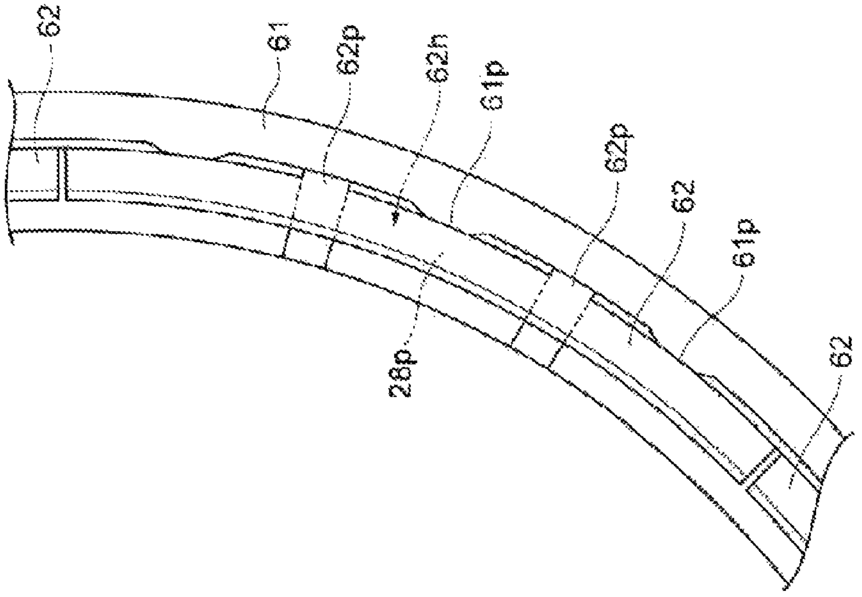

Hereinafter, FIGS. 17, 18A, and 18B will be referred to. FIG. 17 schematically illustrates a substrate processing apparatus according to further still another embodiment. FIGS. 18A and 18B are partially enlarged plan views of a contact mechanism in a substrate processing apparatus according to further still another embodiment. A substrate processing apparatus 10 shown in FIG. 17 is different from the substrate processing apparatus 1 in that it includes a contact mechanism 60C. As shown in FIGS. 17, 18A, and 18B, the contact mechanism 60C includes a tubular body 61, pressing bodies 62, and a driving device 63.

The tubular body 61 is made of a conductive material such as aluminum. The tubular body 61 is electrically connected to the conductor portion 28 and extends along an outer circumference of the conductor portion 28. The pressing bodies 62 are made of a conductive material such as aluminum. The pressing bodies 62 are disposed between the substrate support 12 and the tubular body 61. The driving device 63 is configured to rotate the tubular body 61 along the circumferential direction. The driving device 63 includes a motor, for example. The contact mechanism 60C presses the pressing bodies 62 against an outer peripheral surface of the lower end 16*e* of the sidewall portion 16*s* by the rotation of the tubular body 61 in the circumferential direction. Accordingly, the contact mechanism 60C electrically connects the inner wall member 16 to the conductor portion 28 via the pressing bodies 62 and the tubular body 61.

In one example, the conductor portion 28 includes a plurality of radially projecting guides 28*p*. The guides 28*p* are arranged along the circumferential direction. The contact mechanism 60C includes the plurality of pressing bodies 62. The pressing bodies 62 are arranged along the circumferential direction. Each of the pressing bodies 62 has a hole 62*h* into which the corresponding guide among the guides 28*p* is inserted. Each of the pressing bodies 62 is movable in the radial direction by the corresponding guide inserted into the hole 62*h*. Each of the pressing bodies 62 further has protrusions 62*p* projecting radially outward. In the illustrated example, each of the pressing bodies 62 has a pair of rib-shaped protrusions 62*p* on both sides of the hole 62*h*. The tubular body 61 has a plurality of protrusions 61*p* projecting radially inward. The protrusions 61*p* are arranged along the circumferential direction.

As shown in FIG. 18A, when the protrusions 62*p* of the pressing bodies 62 are not in contact with the corresponding protrusions among the protrusions 61*p*, the pressing bodies 62 are not in contact with the lower end 16*e* of the sidewall portion 16*s*. When the protrusions 62*p* of the pressing bodies 62 are into contact with the corresponding protrusions among the protrusions 61*p* as shown in FIG. 18B by rotating the tubular body 61, the pressing bodies 62 are pressed against the outer peripheral surface of the lower end 16*e* of the sidewall portion 16*s*. Accordingly, the inner wall member 16 is electrically connected to the conductor portion 28 via the pressing bodies 62 and the tubular body 61. In the state shown in FIG. 18B, the lower end 16*e* of the sidewall portion 16*s* can be embedded between each of the pressing bodies 62 and the insulating portion 26.

Figure 19:
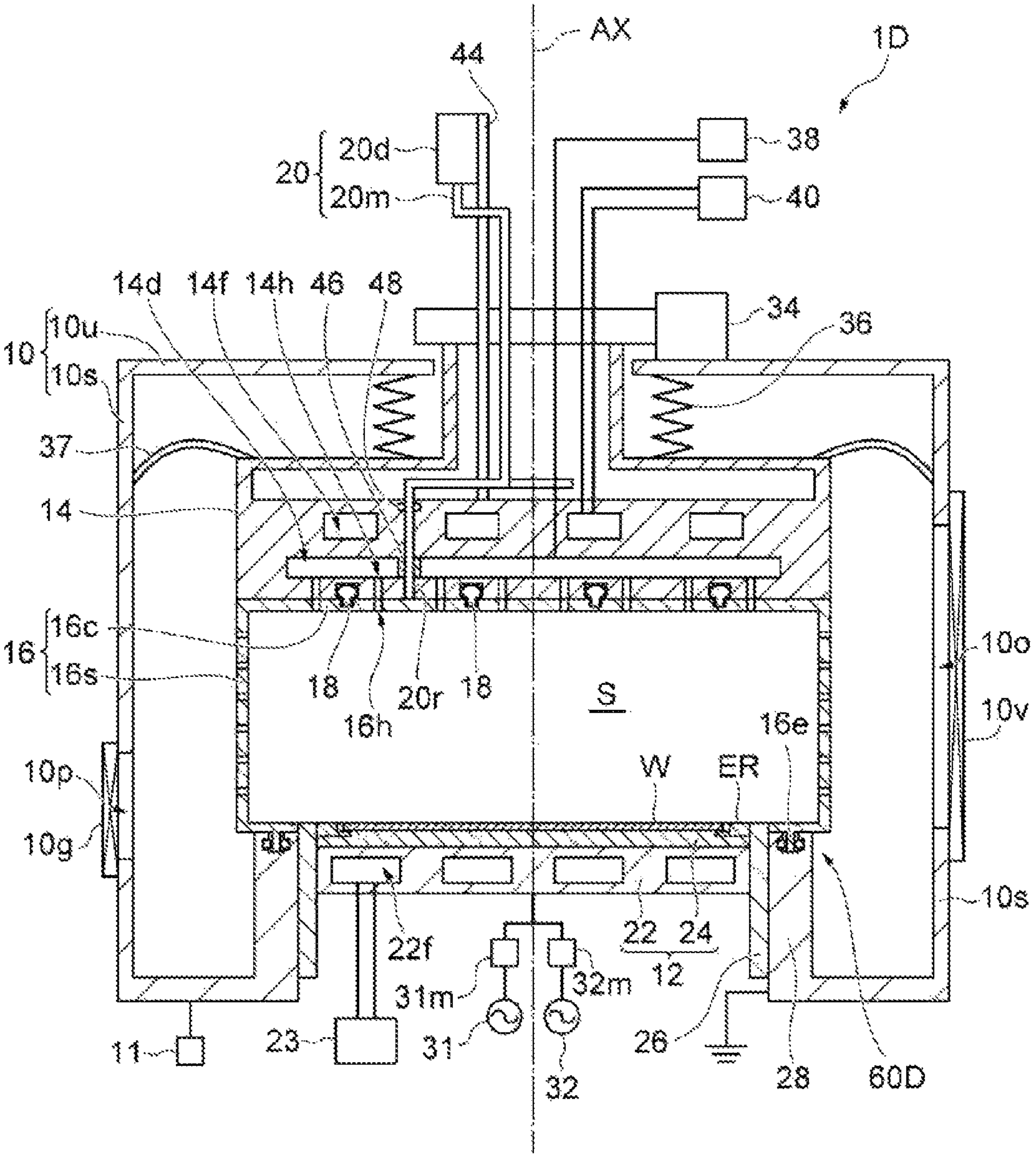
FIG. 19 schematically shows a substrate processing apparatus according to further still another embodiment.
Figure 20:
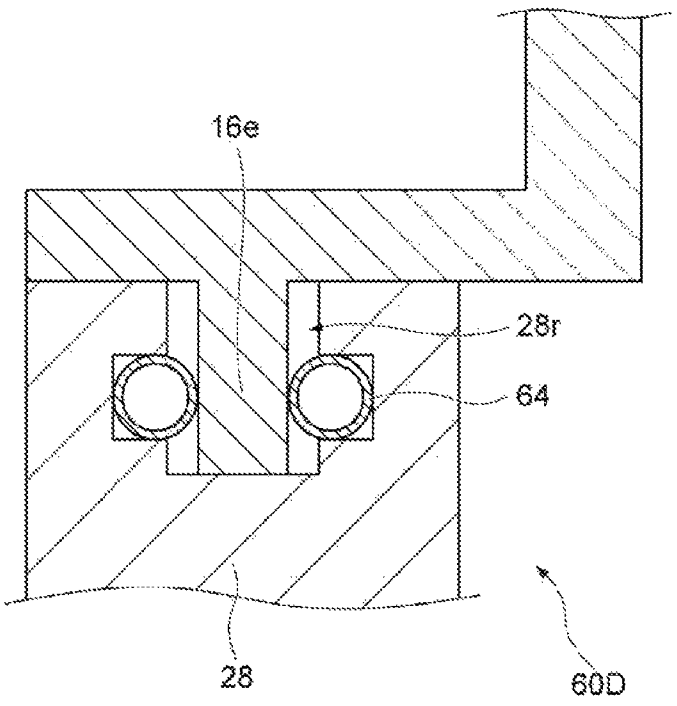
FIG. 20 is a partially enlarged cross-sectional view of a contact mechanism in a substrate processing apparatus according to further still another embodiment.

Hereinafter, FIGS. 19 and 20 will be referred to. FIG. 19 schematically illustrates a substrate processing apparatus according to further still another embodiment. FIG. 20 is a partially enlarged cross-sectional view of a contact mechanism in a substrate processing apparatus according to further still another embodiment. A substrate processing apparatus 1D shown in FIG. 19 is different from the substrate processing apparatus 1 in that it includes a contact mechanism 60D.

As shown in FIGS. 19 and 20, in the substrate processing apparatus 1D, the conductor portion 28 has a recess 28*r* extending in the circumferential direction at an upper end thereof. The contact mechanism 60D includes contact members 64. The contact member 64 is an elastic conductive member, such as a spiral spring gasket. The contact member 64 extends in the circumferential direction in the recess 28*r* and is electrically connected to the conductor portion 28. In the contact mechanism 60D, the contact member 64 is in elastic contact with the lower end 16*e* of the sidewall portion 16*s* disposed in the recess 28*r*. Accordingly, the contact mechanism 60D electrically connects the inner wall member 16 to the conductor portion 28 via the contact member 64. As illustrated in FIG. 20, the lower end 16*e* of the sidewall portion 16*s* in the recess 28*r* may be embedded between a pair of contact members 64.

Figure 21:
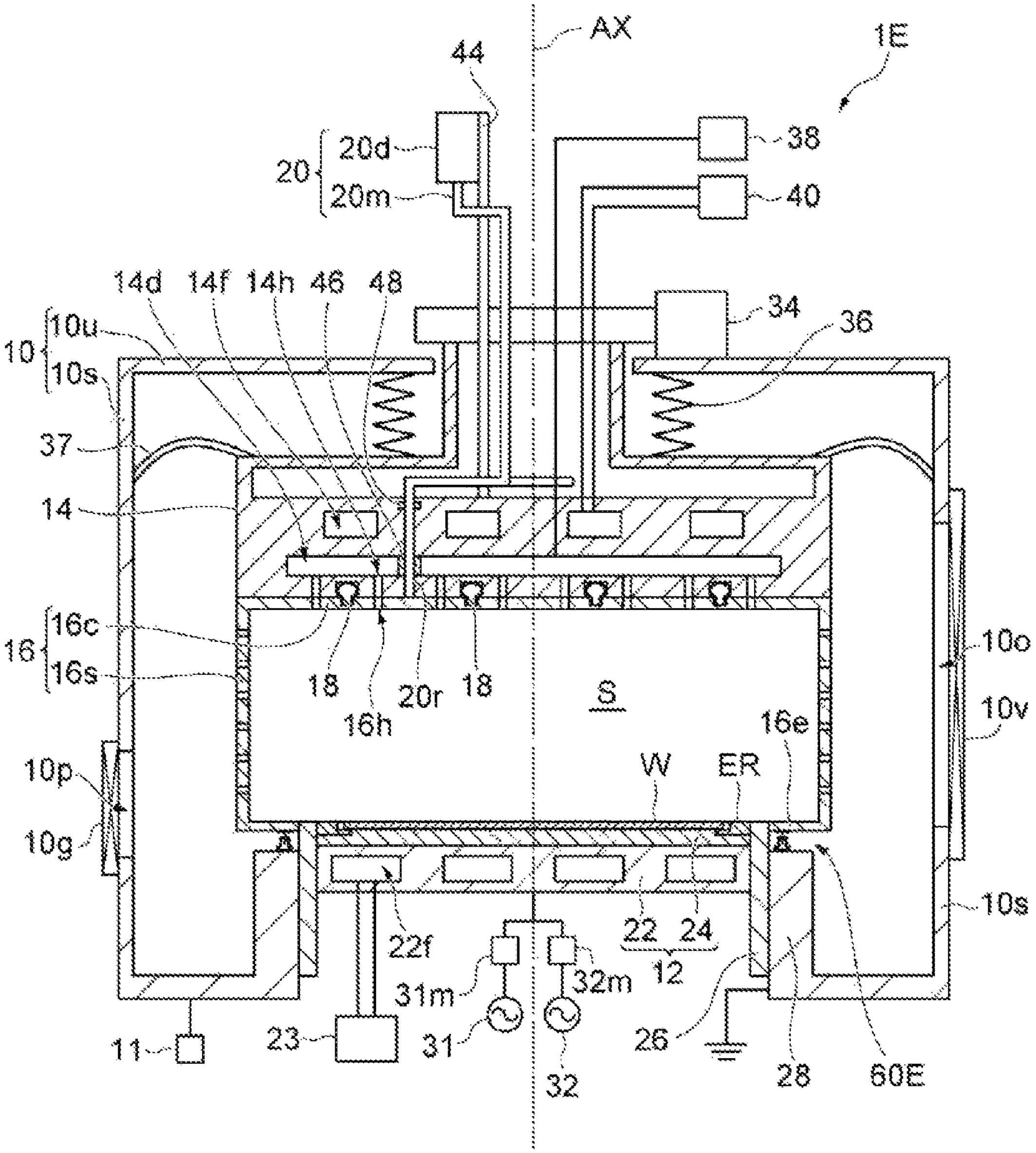
FIG. 21 schematically shows a substrate processing apparatus according to further still another embodiment.
Figure 22:
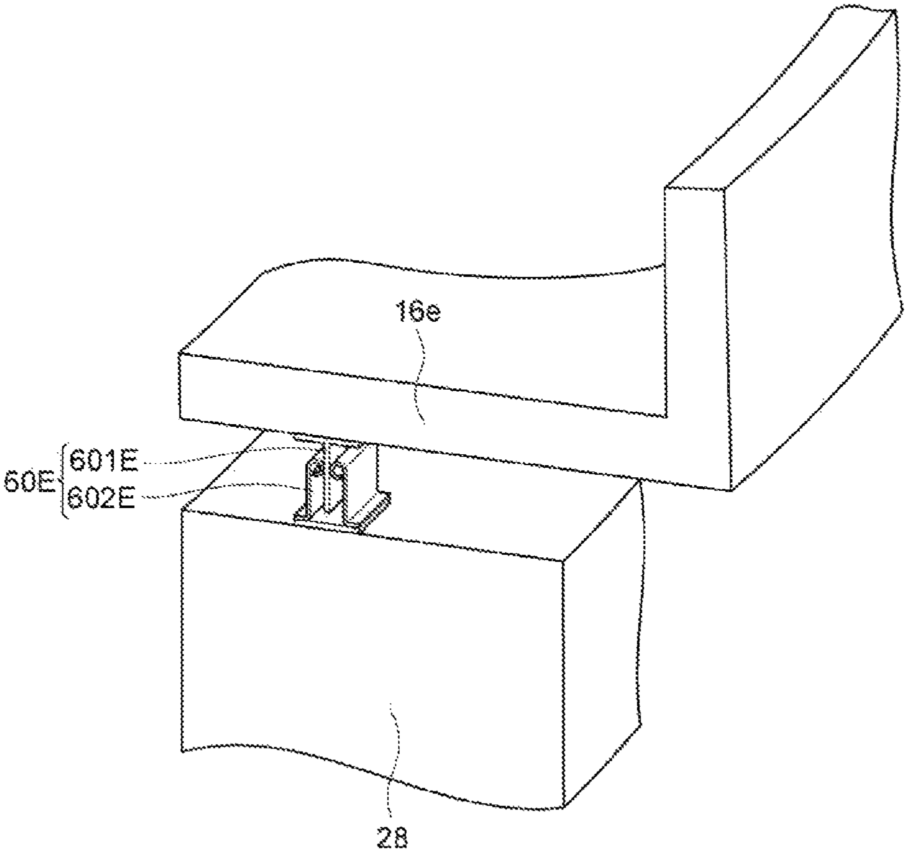
FIG. 22 is a partially enlarged perspective view of a contact mechanism in a substrate processing apparatus according to further still another embodiment.

Hereinafter, FIGS. 21 and 22 will be referred to. FIG. 21 schematically illustrates a substrate processing apparatus according to further still another embodiment. FIG. 22 is a partially enlarged perspective view of a contact mechanism in a substrate processing apparatus according to further still another embodiment. A substrate processing apparatus 1E shown in FIG. 21 is different from the substrate processing apparatus 1 in that it includes a contact mechanism 60E.

As shown in FIGS. 21 and 22, the contact mechanism 60E includes a plurality of male connectors 601E and a plurality of female connectors 602E. The male connectors 601E are attached to the lower end 16*e* of the sidewall portion 16*s* and arranged along the circumferential direction. The female connectors 602E are attached to an upper end of the conductor portion 28 and arranged along the circumferential direction. In the contact mechanism 60E, the male connectors 601E are coupled to the corresponding female connectors among the female connectors 602E, thereby electrically connecting the inner wall member 16 to the conductor portion 28. The male connectors 601E may be attached to the upper end of the conductor portion 28, and the female connectors 602E may be attached to the lower end 16*e* of the sidewall portion 16*s*.

Figure 23:
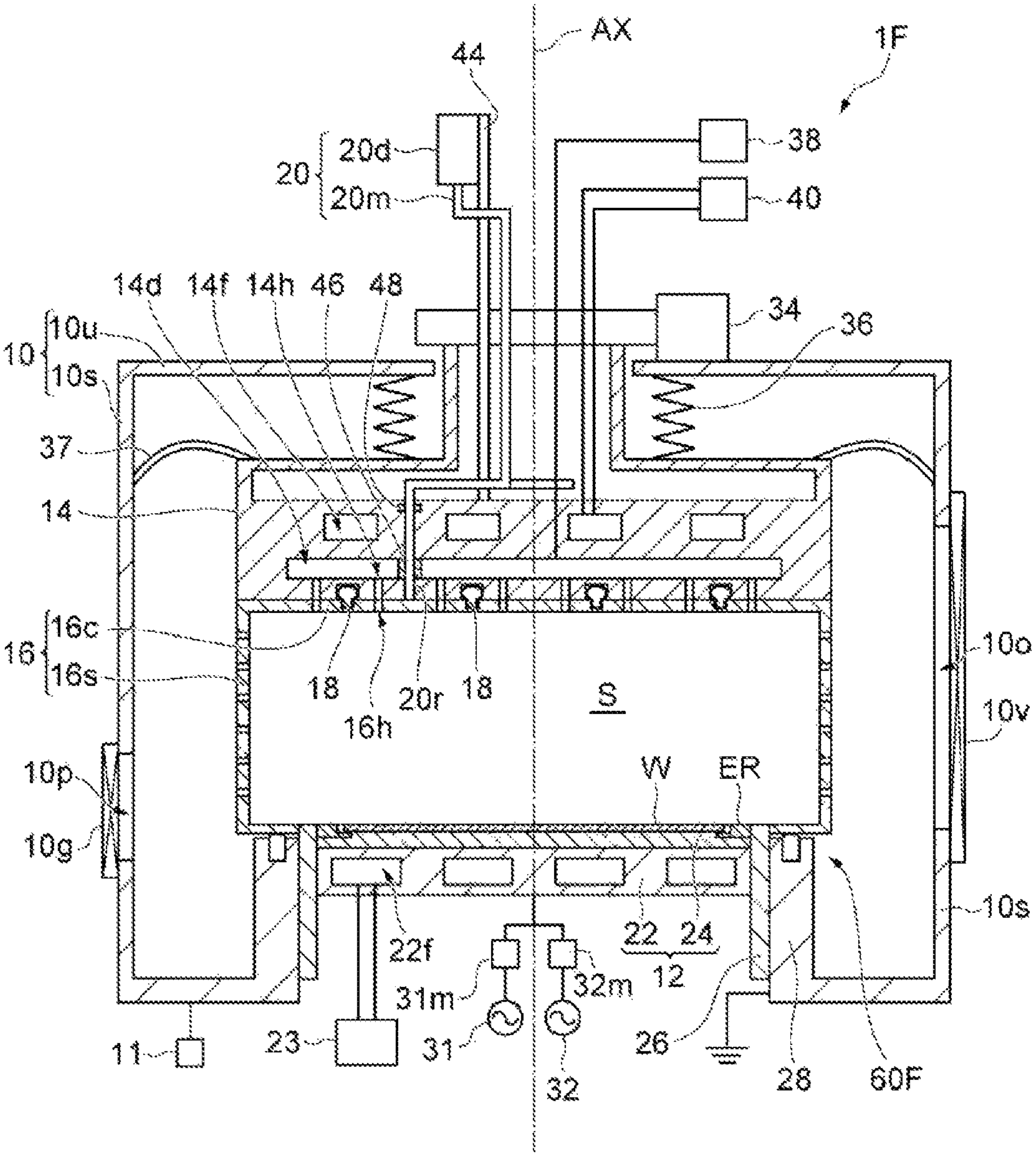
FIG. 23 schematically shows a substrate processing apparatus according to further still another embodiment.
Figure 24:
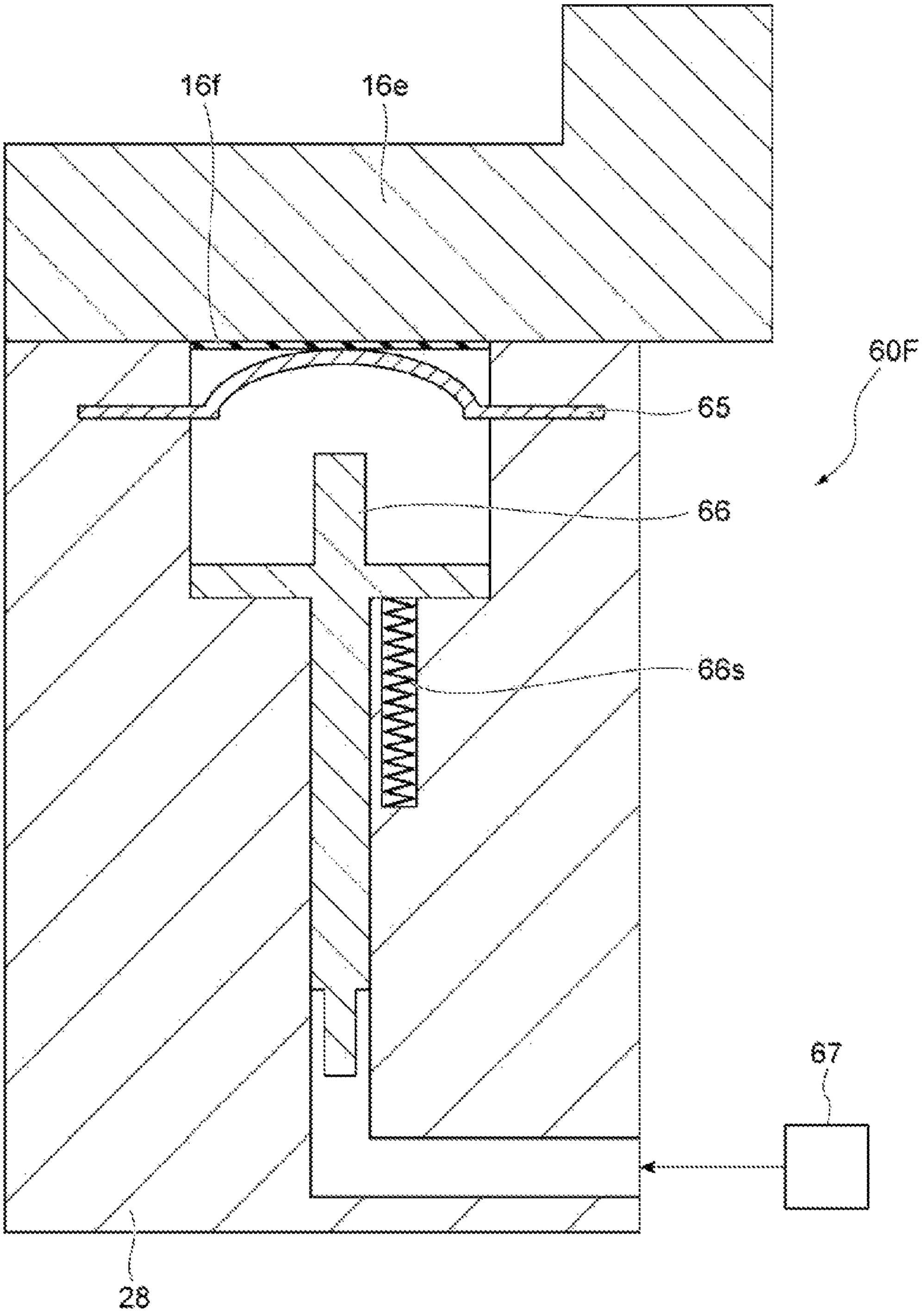
FIG. 24 is a partially enlarged cross-sectional view of a contact mechanism in a substrate processing apparatus according to further still another embodiment.

Hereinafter, FIGS. 23 and 24 will be referred to. FIG. 23 schematically illustrates a substrate processing apparatus according to further still another embodiment. FIG. 24 is a partially enlarged cross-sectional view of a contact mechanism in a substrate processing apparatus according to further still another embodiment. A substrate processing apparatus 1F shown in FIG. 23 is different from the substrate processing apparatus 1 in that it includes a contact mechanism 60F.

The contact mechanism 60F includes a contact member 65. The contact member 65 is a flexible thin film made of a conductive material. The contact member 65 is disposed in a recess of the conductor portion 28. The contact member 65 is supported by the conductor portion 28 and electrically connected to the conductor portion 28. Further, the contact member 65 is disposed to be in contact with a bottom surface of the lower end 16*e* of the sidewall portion 16*s*. In the contact mechanism 60F, the contact member 65 is pressed against the bottom surface of the sidewall portion 16*s*, thereby electrically connecting the inner wall member 16 to the conductor portion 28 via the contact member 65. The bottom surface of the lower end 16*e* of the sidewall portion 16*s* may have a film 16*f* of the lower end 16*e*. The film 16*f* may be a conductive film or a carbon nanotube.

In one example, in the contact mechanism 60F, the contact member 64 may be pressed against the bottom surface of the sidewall portion 16*s* by a pressure of fluid (e.g., gas). In this example, the contact mechanism 60F may further include a pressing pin 66. The pressing pin 66 is disposed such that the contact member 65 is positioned between a tip end of the pressing pin 66 and the bottom surface of the sidewall portion 16*s*. The pressing pin 66 presses the contact member 65 against the bottom surface of the sidewall portion 16*s* by a pressure of a gas supplied from a gas supply device 67. A spring 66*s* may be connected to the pressing pin 66 to bias the pressing pin 66 in a direction in which the pressing pin 66 is separated from the contact member 65.

Figure 25:
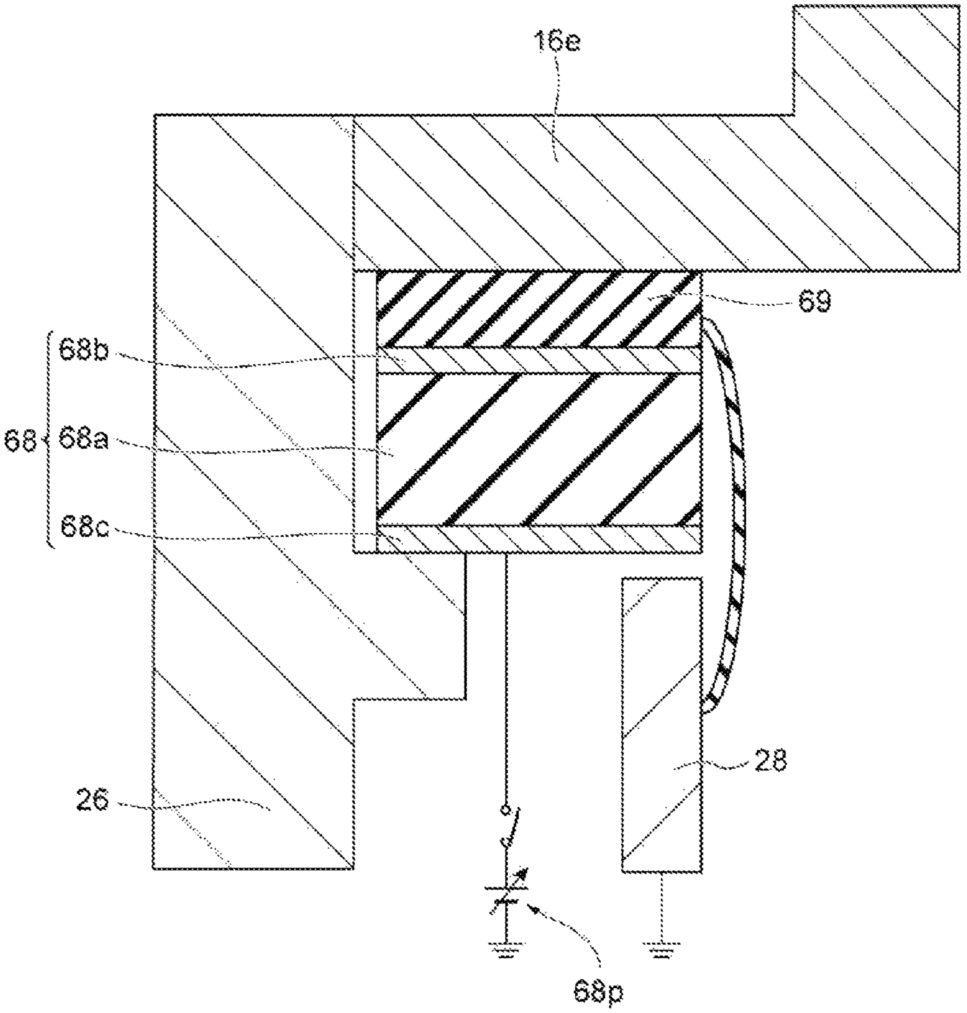
FIG. 25 is a partially enlarged cross-sectional view of a contact mechanism according to further still another embodiment.

Hereinafter, FIG. 25 will be referred to. FIG. 25 is a partially enlarged cross-sectional view of a contact mechanism according to further still another embodiment. The contact mechanism shown in FIG. 25 includes a piezoelectric element 68. The piezoelectric element 68 is supported by the insulating portion 2 and is disposed below the lower end 16*e* of the sidewall portion 16*s*. The piezoelectric element 68 includes a piezoelectric ceramic portion 68*a* and a pair of electrodes 68*b* and 68*c*. The piezoelectric ceramic portion 68*a* is disposed between the pair of electrodes 68*b* and 68*c*. A conductor 69 is fixed to an upper surface of the piezoelectric element 68. The conductor 69 is electrically connected to the conductor portion 28. By applying a voltage from a power supply 68*p* to the electrode 68*c*, the piezoelectric element 68 extends toward the lower end 16*e* of the sidewall portion 16*s*. Accordingly, the conductor 69 is pressed against the bottom surface of the lower end 16*e* of the sidewall portion 16*s*. As a result, the inner wall member 16 is electrically connected to the conductor portion 28.

Figure 26:
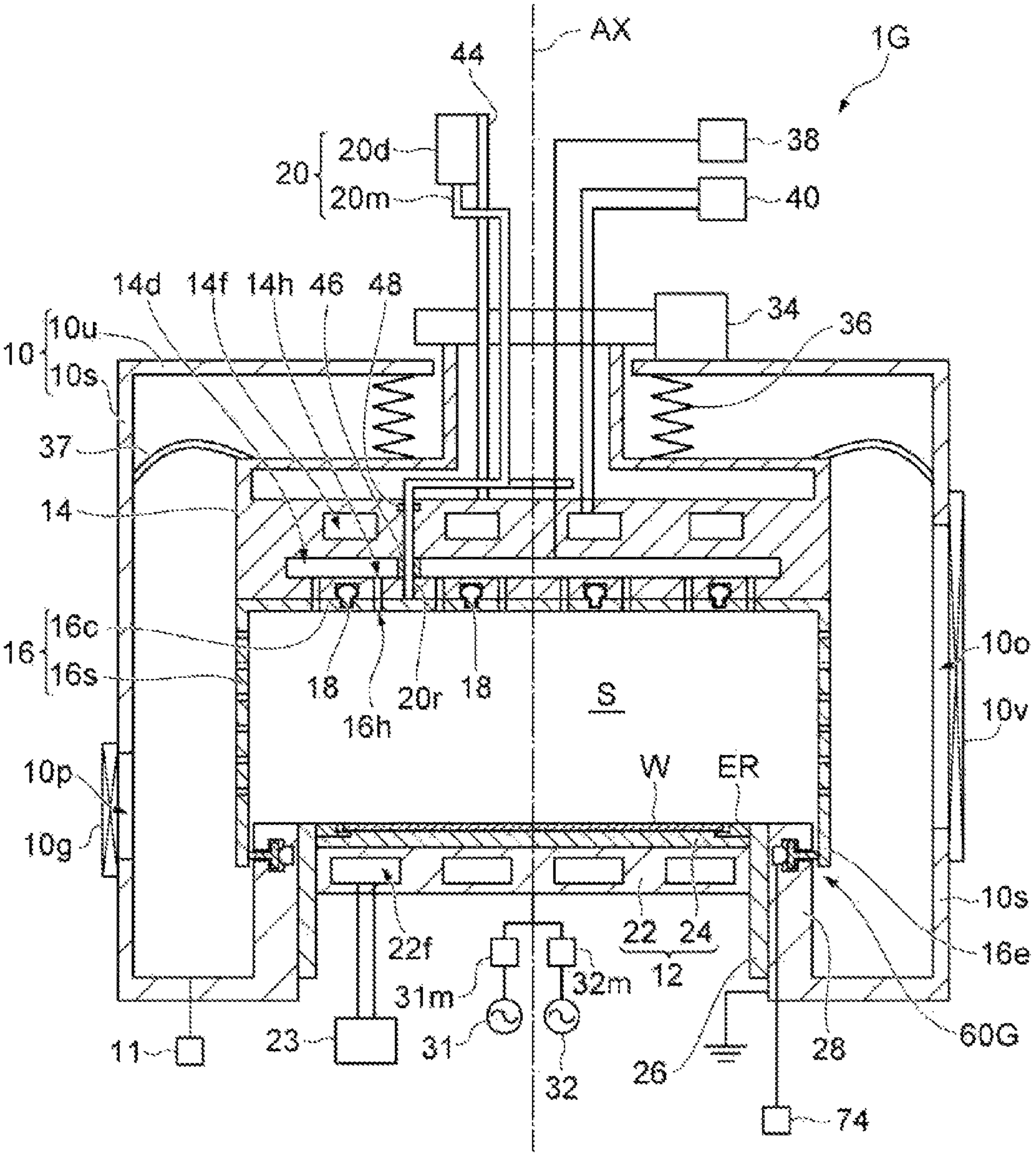
FIG. 26 schematically shows a substrate processing apparatus according to further still another embodiment.
Figure 27B:
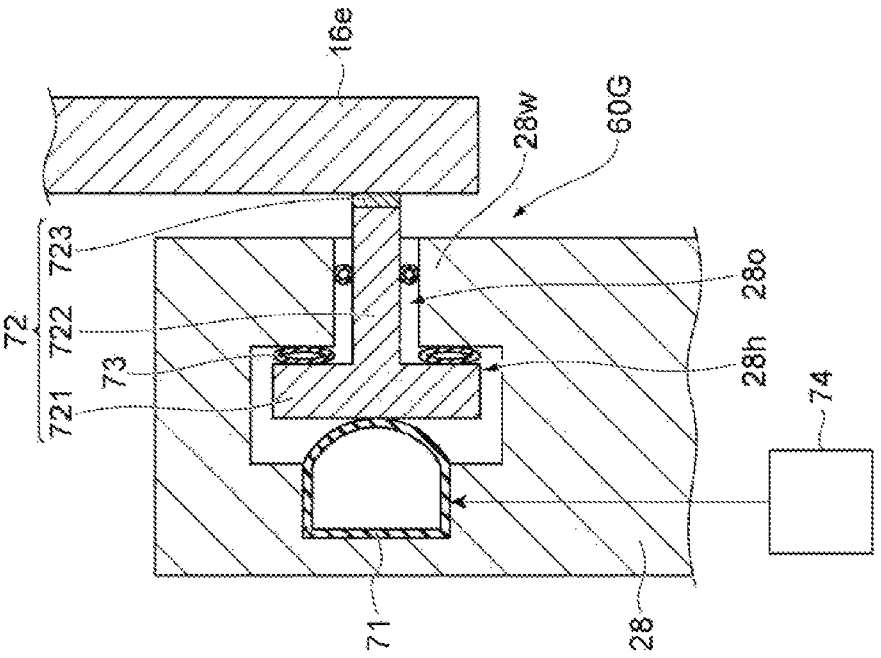
FIGS. 27A and 27B are partially enlarged cross-sectional views of a contact mechanism in a substrate processing apparatus according to further still another embodiment.
Figure 27A:
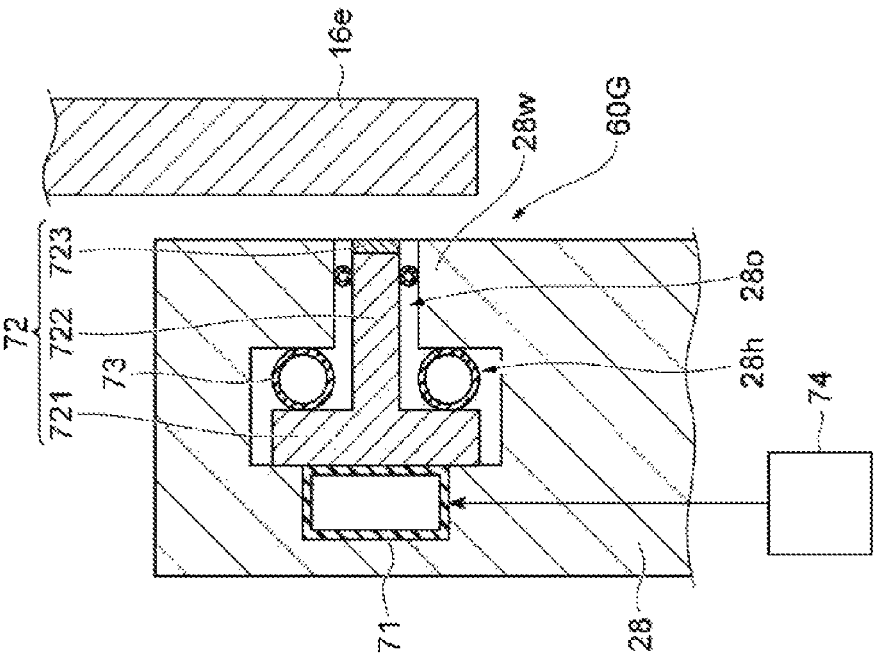

Hereinafter, FIGS. 26, 27A, and 27B will be referred to. FIG. 26 schematically illustrates a substrate processing apparatus according to further still another embodiment. FIGS. 27A and 27B are partially enlarged cross-sectional view of a contact mechanism in a substrate processing apparatus according to further still another embodiment. A substrate processing apparatus 1G shown in FIG. 26 is different from the substrate processing apparatus 1 in that it includes a contact mechanism 60G.

In the substrate processing apparatus 1G, the conductor portion 28 has a substantially cylindrical shape. The conductor portion 28 has a cavity 28*h* extending along the circumferential direction about the central axis thereof (i.e., the axis AX). Further, the conductor portion 28 has a plurality of openings 28*o* extending between the cavity 28*h* and the space outside the conductor portion 28. The openings 28*o* may be arranged along the circumferential direction. Further, the openings 28*o* may be arranged at regular intervals.

The contact mechanism 60G includes an expandable seal 71, a plurality of pressing bodies 72, one or more elastic bodies 73, and an air supply device 74. The expandable seal 71 is disposed in the cavity 28*h*. The expandable seal 71 may have an annular shape, and may extend in the circumferential direction in the cavity 28*h*. The air supply device 74 is configured to supply air to the expandable seal 71. The expandable seal 71 is configured to radially expand by air from the air supply device 74.

Each of the pressing bodies 72 is made of a conductive material such as a metal (e.g., aluminum). Each of the pressing bodies 72 includes a first portion 721 and a second portion 722. The first portion 721 is disposed between the expandable seal 71 and a wall 28*w* of the conductor portion 28 that partitions the openings 280. The second portion 722 extends from the first portion 721 into a corresponding opening among the openings 280. In one embodiment, a tip end 723 (radial tip end) of the second portion 722 may be formed as a contact band.

One or more elastic bodies 73 are made of a conductive material. One or more elastic bodies 73 are disposed between the first portion 721 and the wall 28*w*. One or more elastic bodies 73 may have an annular shape, and may extend in the circumferential direction in the cavity 28*h*. One or more elastic bodies 73 may be a canted coil spring, for example. In the illustrated example, one of the two elastic bodies 73 is disposed above the second portion 722, and the other one is disposed below the second portion 722.

As shown in FIG. 27A, the second portion 722 of each of the pressing bodies 72 is not in contact with the inner peripheral surface of the lower end 12*e* of the inner wall member 16 in a state where the expandable seal 71 is not expanded. On the other hand, as shown in FIG. 27B, when the expandable seal 71 is expanded in the radial direction, in each of the pressing bodies 72, one or more elastic bodies 73 are embedded between the first portion 721 and the wall 28*w*, and the tip end 723 of the second portion 722 is brought into contact with the inner peripheral surface of the lower end 12*e*.

In the contact mechanism 60G, each of the pressing bodies 72 is moved in the radial direction to bring the tip end 723 of the second portion 722 into contact with the inner peripheral surface of the lower end 12*e*, thereby electrically connecting the inner wall member 16 to the conductor portion 28 via the pressing bodies 72 and one or more elastic bodies 73. Therefore, it is possible to electrically connect the inner wall member 16 to the conductor portion 28 without causing friction between the members of the contact mechanism 60G and the inner wall member 16. Accordingly, in the contact mechanism 60G, the generation of particles due to friction can be suppressed. The substrate processing apparatus 1G may include one pressing body 72 and one opening 280.

Figure 28:
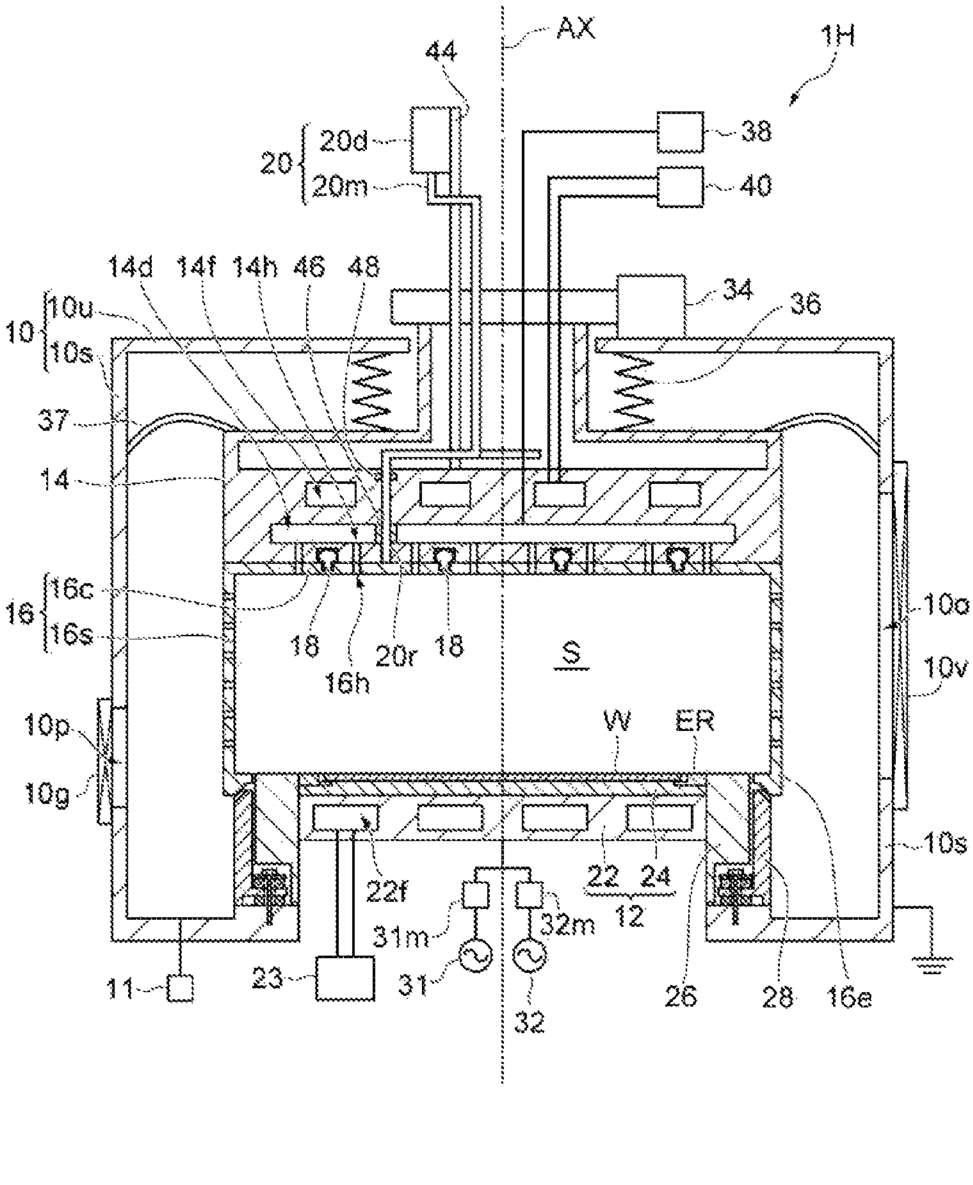
FIG. 28 schematically shows a substrate processing apparatus according to further still another embodiment.
Figure 29:
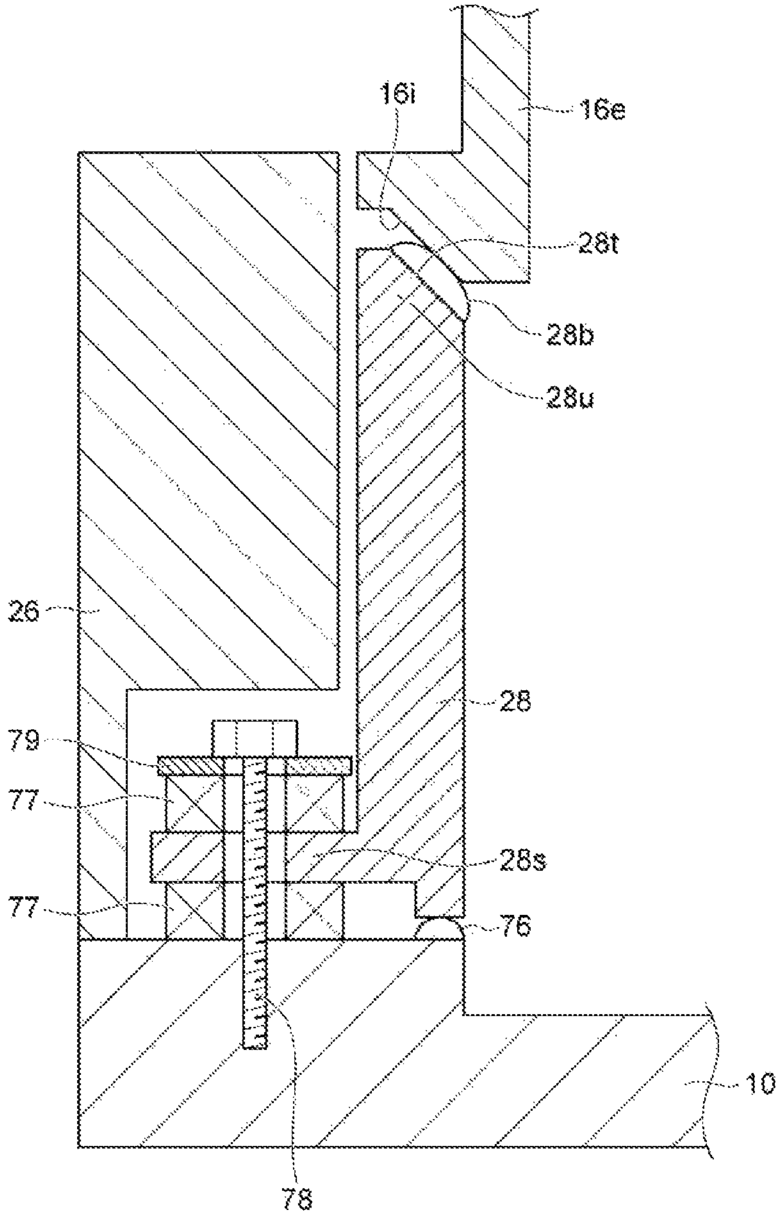
FIG. 29 is a partially enlarged cross-sectional view of a substrate processing apparatus according to further still another embodiment.

Hereinafter, FIGS. 28 and 29 will be referred to. FIG. 28 schematically illustrates a substrate processing apparatus according to further still another embodiment. FIG. 29 is an enlarged partial cross-sectional view of a substrate processing apparatus according to further still another embodiment. Hereinafter, the differences between the substrate processing apparatus 1H shown in FIG. 28 and the substrate processing apparatus 1 will be described.

In the substrate processing apparatus 1H, the conductor portion 28 has a substantially tubular shape. The conductor portion 28 is disposed above the bottom portion of chamber 10 to be slidable in any horizontal direction. In one embodiment, the substrate processing apparatus 1H may further include a thrust bearing 77. The thrust bearing 77 is disposed between the bottom portion of the chamber 10 and a head of a bolt 78 screwed to the bottom portion of the chamber 10. The conductor portion 28 is slidably supported above the bottom portion of the chamber 10 via the thrust bearing 77. In one embodiment, the conductor portion 28 has a reduced diameter portion 28*s* at a lower end portion thereof. The reduced diameter portion 28*s* is disposed between the thrust bearing 77 and the head of the bolt 78. Further, in the illustrated example, two thrust bearings 77 are disposed between the bottom portion of the chamber 10 and the head of the bolt 78. One of the two thrust bearings 77 is disposed between the bottom portion of the chamber 10 and the reduced diameter portion 28*s*. The other thrust bearing 77 is disposed between the reduced diameter portion 28*s* and the head of the bolt 78. A washer 79 is disposed between the other thrust bearing 77 and the head of the bolt 78.

The conductor portion 28 has a substantially tubular shape, and an outer peripheral surface 28*t* of a top portion 28*u* thereof is tapered. An inner peripheral surface 16*i* of the lower end 16*e* of the sidewall portion 16*s* of the inner wall member 16 is tapered to correspond to the outer peripheral surface 28*t*. The outer peripheral surface 28*t* and the inner peripheral surface 16*i* are in direct or indirect contact with each other. Accordingly, the inner wall member 16 is electrically connected to the conductor portion 28. In one embodiment, a contact band 28*b* is disposed on the outer peripheral surface 28*t*. The outer peripheral surface 28*t* and the inner peripheral surface 16*i* are in indirect contact with each other via the contact band 28*b*. Further, the lower end of the conductor portion 28 and the bottom portion of the chamber 10 may be electrically connected via a connection member 76. The connection member 76 is a member having elasticity and conductivity, and is fixed to the bottom portion of the chamber 10. The connection member 76 is, e.g., a contact band or a conductive spiral.

In the substrate processing apparatus 1H, even if the central axis of the inner wall member 16 and the central axis of the conductor portion 28 are misaligned, the horizontal movement of the conductor portion 28 enables uniform electrical contact between the lower end 16*e* of the inner wall member 16 and the top portion 28*u* of the conductor portion 28 in the circumferential direction. Since there is less friction between the lower end 16*e* of the inner wall member 16 and the top portion 28*u* (or the contact band 28*b*) of the conductor portion 28, the generation of particles is suppressed.

Figure 30:
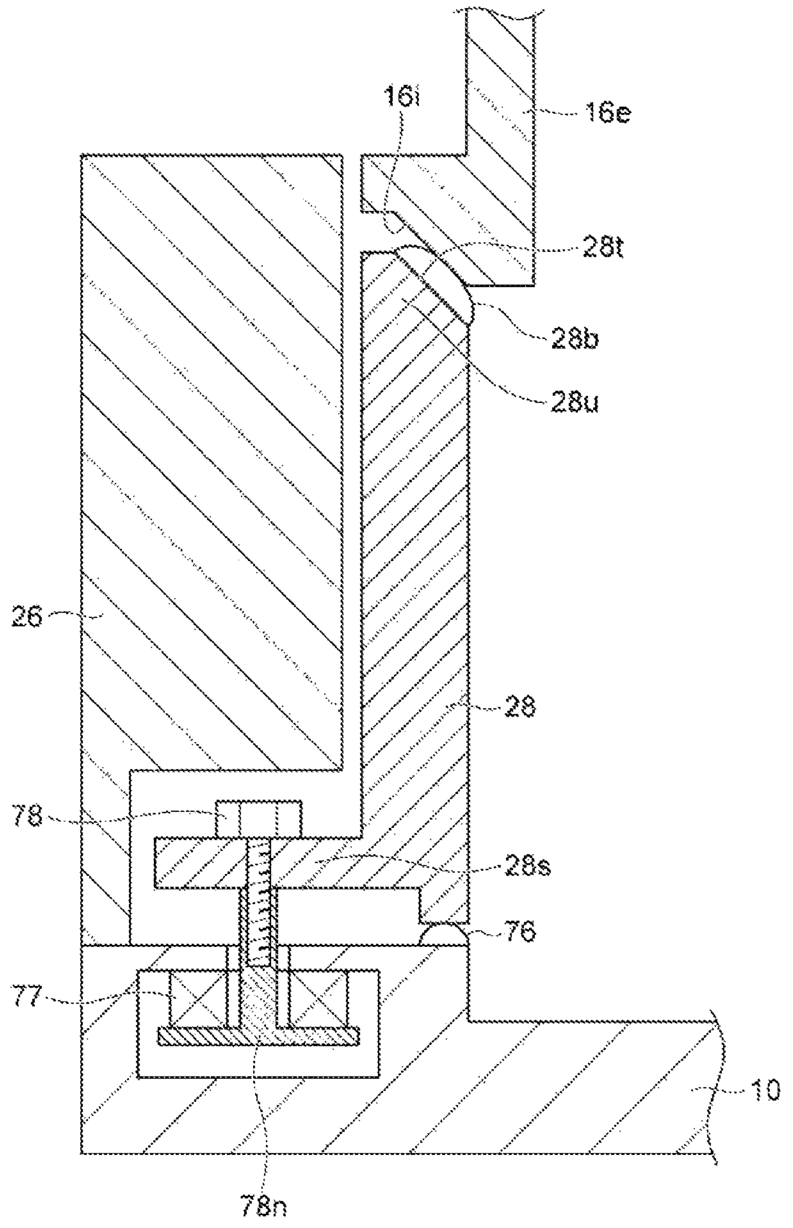
FIG. 30 is a partially enlarged cross-sectional view of a substrate processing apparatus according to further still another embodiment.

Hereinafter, FIG. 30 will be referred to. FIG. 30 is a partially enlarged cross-sectional view of a substrate processing apparatus according to further still another embodiment. Hereinafter, the differences between the structure shown in FIG. 30 and the structure of the substrate processing apparatus shown in FIGS. 28 and 29 will be described. As shown in FIG. 30, the bolt 78 may be screwed to a thrust nut 78*n* disposed below the reduced diameter portion 28*s*, and the reduced diameter portion 28*s* may be interposed between the head of the bolt 78 and the thrust nut 78*n*. Further, the thrust bearing 77 may be disposed in the cavity in the bottom portion of the chamber 10, or may be disposed between the upper wall that partitions the cavity and the thrust nut 78*n*.

Figure 31:
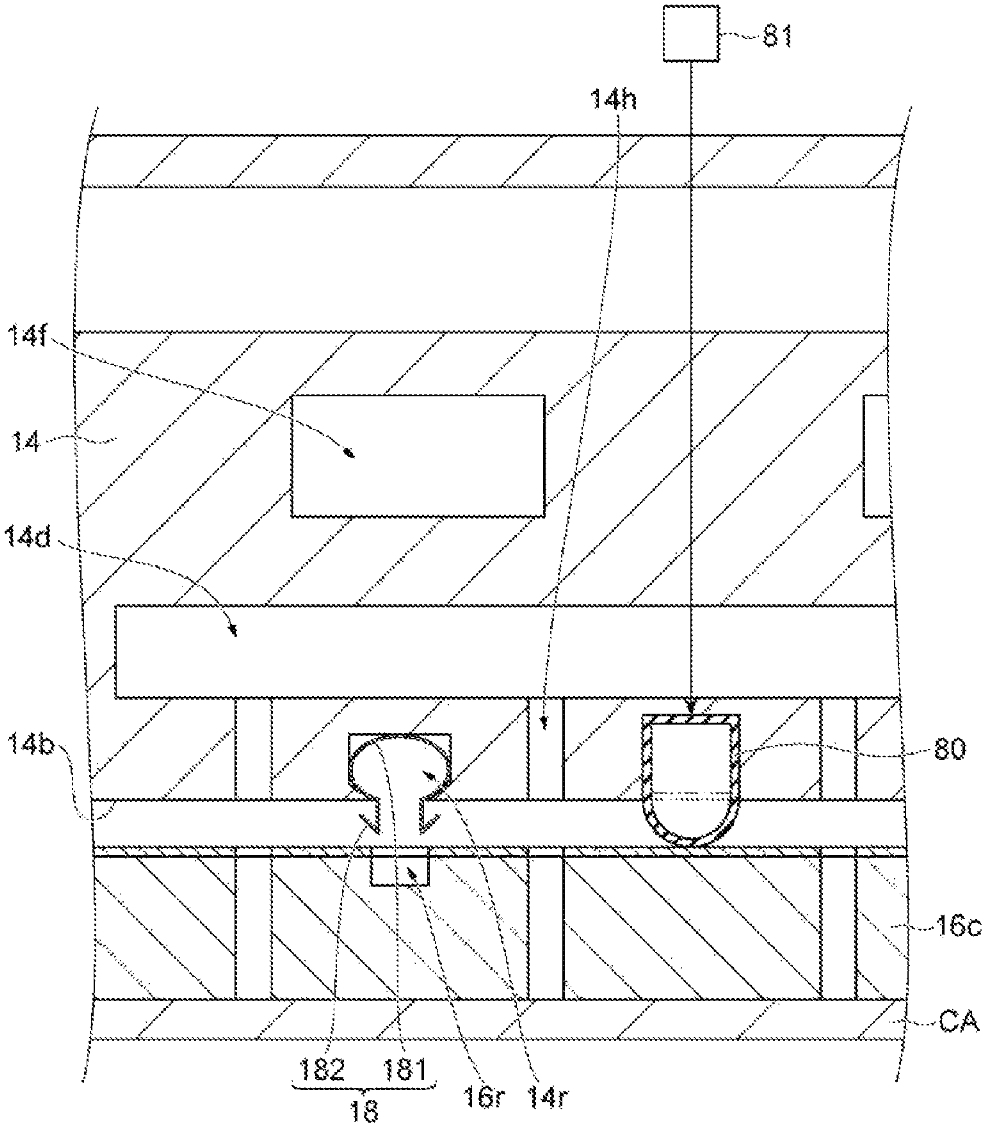
FIG. 31 is a partially enlarged cross-sectional view of a substrate processing apparatus according to further still another embodiment.

Hereinafter, FIG. 31 will be referred to. FIG. 31 is a partially enlarged cross-sectional view of a substrate processing apparatus according to further still another embodiment. In the above-described various embodiments, as shown in FIG. 31, an expandable seal 80 may be used instead of the actuator 20 to release the fixing of the inner wall member 16 to the support member 14.

Specifically, the expandable seal 80 is disposed in the recess on the bottom surface 14*b* of the support member 14. The expandable seal 80 is expanded downward by air supplied from the air supply device 81. Due to the downward expansion of the expandable seal 80, the inner wall member 16 is moved downward, thereby releasing the fixing of the inner wall member 16 to the support member 14.

While various embodiments have been described above, the present disclosure is not limited to the above-described embodiments, and various additions, omissions, substitutions and changes may be made. Further, other embodiments can be implemented by combining elements in different embodiments.

The transfer module CTM may not be movable, and may be connected and fixed to the chambers of the substrate processing apparatuses according to the above-described various embodiments. The transfer module TM may be used, instead of the transfer module CTM, as a module for transferring the inner wall member 16 between the inside of the chamber 10 and the outside of the chamber 10.

The following is description of various embodiments [E1] to [E31] included in the present disclosure.

[E1]

A substrate processing apparatus comprising:
- a chamber including a sidewall having an opening;
- a substrate support disposed in the chamber;
- a support member disposed above the substrate support;
- an inner wall member having a ceiling portion disposed above the substrate support and below the support member;
- a contact member attached to one of the support member and the inner wall member and configured to detachably fix the inner wall member to the support member by applying a spring reaction force to the other of the support member and the inner wall member in a horizontal direction; and
- an actuator configured to move the inner wall member downward to release the fixing of the inner wall member to the support member.

In the substrate processing apparatus of the embodiment [E1], the contact member is deformed by the other member between the support member and the inner wall member, thereby applying a spring reaction force to the other member in the horizontal direction. Accordingly, the inner wall member is fixed to the support member. Further, the fixing of the inner wall member to the support member can be easily released by moving the inner wall member downward using the actuator against the spring reaction force of the contact member. The inner wall member released from the support member can be unloaded from the chamber to the outside through the opening of the sidewall of the chamber. Therefore, in accordance with the embodiment [E1], it is possible to easily perform the maintenance of the inner wall member.

[E2]

The substrate processing apparatus of [E1], wherein a bottom surface of the support member has a recess, an upper surface of the ceiling portion has a recess, and the contact member includes:

a first portion fitted into the recess of the support member; and a second portion extending downward from the first portion and having a spring fitted into the recess of the ceiling portion to apply the spring reaction force.

[E3]

The substrate processing apparatus of [E2], wherein the contact member is detachable from the support member, and the first portion has elasticity to be extracted from the recess of the support member by horizontal deformation thereof in the case of separating the contact member from the support member.

[E4]

The substrate processing apparatus of [E3], wherein the recess of the support member is narrowed at a lower opening thereof.

[E5]

The substrate processing apparatus of [E1], wherein the upper surface of the ceiling portion has a protrusion, the contact member is fixed in a recess on the bottom surface of the support member and has an opening opened downward, the contact member has a spring disposed in the recess of the contact member, and the spring of the contact member applies the spring reaction force when the protrusion of the ceiling portion is fitted into the recess of the contact member.

[E6]

The substrate processing apparatus of [E5], wherein the contact member further includes a floating mechanism configured to support the spring.

[E7]

The substrate processing apparatus of [E5] or [E6], wherein the bottom surface of the support member has a female screw, and an outer peripheral surface of the contact member has a male screw screwed into the female screw.

[E8]

The substrate processing apparatus of [E1], wherein the bottom surface of the support member has a recess, the upper surface of the ceiling portion has a protrusion, and the contact member is fixed to the ceiling portion to cover the protrusion, and has a spring that applies the spring reaction force when the protrusion and the contact member are fitted into the recess of the support member.

[E9]

The substrate processing apparatus of [E1], wherein the bottom surface of the support member has a recess, the upper surface of the ceiling portion has a protrusion, the contact member is a spiral spring gasket disposed along an inner wall surface that defines the recess, and the spiral spring gasket applies the spring reaction force when the protrusion is fitted into the recess.

[E10]

The substrate processing apparatus of any one of [E1] to [E9], wherein the inner wall member is transferred between the inside of the chamber and the outside of the chamber through the opening by a transfer arm.

[E11]

The substrate processing apparatus of any one of [E1] to [E10], further comprising:

a heat transfer sheet embedded between the support member and the ceiling portion.

[E12]

The substrate processing apparatus of any one of [E1] to [E11], wherein the support member and the ceiling portion constitute a shower head configured to supply a gas into the chamber.

[E13]

The substrate processing apparatus of any one of [E1] to [E12], wherein the support member has a flow path through which a heat medium flows.

[E14]

The substrate processing apparatus of any one of [E1] to [E13], wherein the inner wall member further has a sidewall portion extending downward from a peripheral edge of the ceiling portion, and forms, together with the substrate support, a processing space in which a substrate placed on the substrate support is processed.

[E15]

The substrate processing apparatus of [E14], wherein the substrate processing apparatus is a plasma processing apparatus.

[E16]

The substrate processing apparatus of [E15], further comprising:

a conductor portion having a tubular shape, extending along an outer circumference of the substrate support, and being grounded; and a contact mechanism that electrically connects a lower end of the sidewall portion to the conductor portion to electrically connect the inner wall member to the conductor portion.

[E17]

The substrate processing apparatus of [E16], wherein the contact mechanism includes:

a tubular body made of a conductive material, electrically connected to the conductor portion, and extending along an outer circumference of the conductor portion;

a pressing body made of a conductive material and disposed between the substrate support and the tubular body; and a driving device configured to rotate the tubular body along a circumferential direction, wherein the contact mechanism is configured to electrically connect the inner wall member to the conductor portion via the pressing body and the tubular body by pressing the pressing body against an outer peripheral surface of the lower end of the sidewall portion by rotating the tubular body in the circumferential direction.

[E18]

The substrate processing apparatus of [E16], wherein an upper end of the conductor portion has a recess extending in the circumferential direction, the contact mechanism includes another contact member having elasticity, said another contact member extends in the circumferential direction in the recess of the conductor portion and is electrically connected to the conductor portion, and said another contact member is configured to electrically connect the inner wall member to the conductor portion via said another contact member while being in elastic contact with the lower end of the sidewall portion in the recess.

[E19]

The substrate processing apparatus of [E16], wherein the contact mechanism includes:

a plurality of male connectors attached to one of the lower end of the sidewall portion and the upper end of the conductor portion; and a plurality of female connectors attached to the other of the lower end of the sidewall portion and the upper end of the conductor portion, wherein the contact mechanism is configured to electrically connect the inner wall member to the conductor portion by coupling the male connectors and corresponding female connectors among the female connectors.

[E20]

The substrate processing apparatus of [E16], wherein the contact mechanism includes another contact member to be in contact with a bottom surface of the lower end of the sidewall portion, and the contact mechanism is configured to electrically connect the inner wall member to the conductor portion via said another contact member by pressing said another contact member against the bottom surface of the sidewall portion.

[E21]

The substrate processing apparatus of [E20], wherein the contact mechanism is configured to press said another contact member against the bottom surface of the sidewall portion by a pressure of fluid.

[E22]

The substrate processing apparatus of [E20], wherein the contact mechanism further includes:

a piezoelectric element configured to press said another contact member against the bottom surface of the sidewall portion.

[E23]

The substrate processing apparatus of any one of [E1] to [E22], wherein the support member constitutes an upper electrode of a capacitively coupled plasma processing apparatus.

[E24]

The substrate processing apparatus of [E16], wherein the conductor portion has therein a cavity extending along the circumferential direction about a central axis of the conductor portion and an opening extending between the cavity and a space outside the conductor portion, the contact mechanism includes:

an expandable seal disposed in the cavity;

a pressing body made of a conductive material and having a first portion disposed between the expandable seal and a wall of the conductor portion that defines the opening in the cavity and a second portion extending from the first portion into the opening;

an elastic body made of a conductive material and disposed between the first portion and the wall of the conductor portion; and an air supply device configured to supply air to the expandable seal, wherein the pressing body is configured to embed the elastic body between the first portion and the wall of the conductor portion when the expandable seal is expanded by the air from the air supply device, and to bring a tip end of the second portion into contact with an inner peripheral surface of the lower end of the sidewall portion.

[E25]

The substrate processing apparatus of [E24], wherein the tip end of the second portion is formed as a contact band.

[E26]

The substrate processing apparatus of [E24] or [E25], wherein the elastic body is a canted coil spring.

[E27]

The substrate processing apparatus of [E15], further comprising:

a conductor portion having a tubular shape and extending along the outer circumference of the substrate support, the conductor portion being grounded and slidable in a horizontal direction above a bottom portion of the chamber, wherein an outer peripheral surface of a top portion of the conductor portion is a tapered surface, the inner peripheral surface of the lower end of the sidewall portion is a tapered surface corresponding to the outer peripheral surface of the top portion of the conductor portion, and the outer peripheral surface of the top portion of the conductor portion and the inner peripheral surface of the lower end of the sidewall portion are configured to be in direct or indirect contact with each other.

[E28]

The substrate processing apparatus of [E27], further comprising:

a contact band disposed on the outer peripheral surface of the top portion of the conductor portion.

[E29]

The substrate processing apparatus of [E27] or [E28], further comprising:

a thrust bearing disposed between the bottom portion of the chamber and a head of a bolt screwed to the bottom portion, wherein the conductor portion is slidably supported above the bottom portion of the chamber via the thrust bearing.

[E30]

A maintenance method for a substrate processing apparatus, comprising:

loading an inner wall member from the outside of a chamber of a substrate processing apparatus into the chamber through an opening of a sidewall of the chamber by a transfer arm, the substrate processing apparatus including the chamber, a substrate support disposed in the chamber, and a support member disposed above the substrate support, the inner wall member having a ceiling portion disposed above the substrate support and below the support member; and detachably fixing the inner wall member to the support member by moving one of the support member and the inner wall member in a vertical direction, wherein the inner wall member is fixed to the support member when the contact member attached to one of the support member and the inner wall member applies a spring reaction force to the other one of the support member and the inner wall member in a horizontal direction.

[E31]

A maintenance method for a substrate processing apparatus, comprising:

allowing a transfer arm to enter a chamber of a substrate processing apparatus from the outside of the chamber through an opening of a sidewall of the chamber, the substrate processing apparatus including the chamber, a substrate support disposed in the chamber, a support member disposed above the substrate support, an inner wall member having a ceiling portion disposed above the substrate support and below the support member, and a contact member attached to one of the support member and the inner wall member, wherein the contact member is configured to detachably fix the inner wall member to the support member by applying a spring reaction force to the other of the support member and the inner wall member in a horizontal direction;

transferring the inner wall member to the transfer arm by moving the inner wall member downward using an actuator to release the fixing of the inner wall member by the contact member; and unloading the inner wall member from the inside of the chamber to the outside of the chamber through the opening.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing apparatus comprising:

a chamber including a sidewall having an opening;

a substrate support disposed in the chamber;

a support member disposed above the substrate support;

an inner wall member having a ceiling portion disposed above the substrate support and below the support member;

a contact member attached to one of the support member and the inner wall member and configured to detachably fix the inner wall member to the support member by applying a spring reaction force to the other of the support member and the inner wall member in a horizontal direction; and an actuator configured to move the inner wall member downward to release the fixing of the inner wall member to the support member.

2. The substrate processing apparatus of claim 1, wherein a bottom surface of the support member has a recess, an upper surface of the ceiling portion has a recess, and the contact member includes:

a first portion fitted into the recess of the support member; and a second portion extending downward from the first portion and having a spring fitted into the recess of the ceiling portion to apply the spring reaction force.

3. The substrate processing apparatus of claim 2, wherein the contact member is detachable from the support member, and the first portion has elasticity to be extracted from the recess of the support member by horizontal deformation thereof in the case of separating the contact member from the support member.

4. The substrate processing apparatus of claim 3, wherein the recess of the support member is narrowed at a lower opening thereof.

5. The substrate processing apparatus of claim 1, wherein the upper surface of the ceiling portion has a protrusion, the contact member is fixed in a recess on the bottom surface of the support member and has an opening opened downward, the contact member has a spring disposed in the recess of the contact member, and the spring of the contact member applies the spring reaction force when the protrusion of the ceiling portion is fitted into the recess of the contact member.

6. The substrate processing apparatus of claim 5, wherein the contact member further includes a floating mechanism configured to support the spring.

7. The substrate processing apparatus of claim 5, wherein the bottom surface of the support member has a female screw, and an outer peripheral surface of the contact member has a male screw screwed into the female screw.

8. The substrate processing apparatus of claim 1, wherein the bottom surface of the support member has a recess, the upper surface of the ceiling portion has a protrusion, and the contact member is fixed to the ceiling portion to cover the protrusion, and has a spring that applies the spring reaction force when the protrusion and the contact member are fitted into the recess of the support member.

9. The substrate processing apparatus of claim 1, wherein the bottom surface of the support member has a recess, the upper surface of the ceiling portion has a protrusion, the contact member is a spiral spring gasket disposed along an inner wall surface that defines the recess, and the spiral spring gasket applies the spring reaction force when the protrusion is fitted into the recess.

10. The substrate processing apparatus of claim 1, wherein the inner wall member is transferred between the inside of the chamber and the outside of the chamber through the opening by a transfer arm.

11. The substrate processing apparatus of claim 1, further comprising:

a heat transfer sheet embedded between the support member and the ceiling portion.

12. The substrate processing apparatus of claim 1, wherein the support member and the ceiling portion constitute a shower head configured to supply a gas into the chamber.

13. The substrate processing apparatus of claim 1, wherein the support member has a flow path through which a heat medium flows.

14. The substrate processing apparatus of claim 1, wherein the inner wall member further has a sidewall portion extending downward from a peripheral edge of the ceiling portion, and forms, together with the substrate support, a processing space in which a substrate placed on the substrate support is processed.

15. The substrate processing apparatus of claim 14, wherein the substrate processing apparatus is a plasma processing apparatus.

16. The substrate processing apparatus of claim 15, further comprising:

a conductor portion having a tubular shape, extending along an outer circumference of the substrate support, and being grounded; and a contact mechanism that electrically connects a lower end of the sidewall portion to the conductor portion to electrically connect the inner wall member to the conductor portion.

17. The substrate processing apparatus of claim 16, wherein the contact mechanism includes:

a tubular body made of a conductive material, electrically connected to the conductor portion, and extending along an outer circumference of the conductor portion;

a pressing body made of a conductive material and disposed between the substrate support and the tubular body; and a driving device configured to rotate the tubular body along a circumferential direction, wherein the contact mechanism is configured to electrically connect the inner wall member to the conductor portion via the pressing body and the tubular body by pressing the pressing body against an outer peripheral surface of the lower end of the sidewall portion by rotating the tubular body in the circumferential direction.

18. The substrate processing apparatus of claim 16, wherein an upper end of the conductor portion has a recess extending in the circumferential direction, the contact mechanism includes another contact member having elasticity, said another contact member extends in the circumferential direction in the recess of the conductor portion and is electrically connected to the conductor portion, and said another contact member is configured to electrically connect the inner wall member to the conductor portion via said another contact member while being in elastic contact with the lower end of the sidewall portion in the recess.

19. The substrate processing apparatus of claim 16, wherein the contact mechanism includes:

a plurality of male connectors attached to one of the lower end of the sidewall portion and the upper end of the conductor portion; and a plurality of female connectors attached to the other of the lower end of the sidewall portion and the upper end of the conductor portion, wherein the contact mechanism is configured to electrically connect the inner wall member to the conductor portion by coupling the male connectors and corresponding female connectors among the female connectors.

20. The substrate processing apparatus of claim 16, wherein the contact mechanism includes another contact member to be in contact with a bottom surface of the lower end of the sidewall portion, and the contact mechanism is configured to electrically connect the inner wall member to the conductor portion via said another contact member by pressing said another contact member against the bottom surface of the sidewall portion.

21. The substrate processing apparatus of claim 20, wherein the contact mechanism is configured to press said another contact member against the bottom surface of the sidewall portion by a pressure of fluid.

22. The substrate processing apparatus of claim 20, wherein the contact mechanism further includes:

a piezoelectric element configured to press said another contact member against the bottom surface of the sidewall portion.

23. The substrate processing apparatus of claim 1, wherein the support member constitutes an upper electrode of a capacitively coupled plasma processing apparatus.

24. The substrate processing apparatus of claim 16, wherein the conductor portion has therein a cavity extending along the circumferential direction about a central axis of the conductor portion and an opening extending between the cavity and a space outside the conductor portion, the contact mechanism includes:

an expandable seal disposed in the cavity;

a pressing body made of a conductive material and having a first portion disposed between the expandable seal and a wall of the conductor portion that defines the opening in the cavity and a second portion extending from the first portion into the opening;

an elastic body made of a conductive material and disposed between the first portion and the wall of the conductor portion; and an air supply device configured to supply air to the expandable seal, wherein the pressing body is configured to embed the elastic body between the first portion and the wall of the conductor portion when the expandable seal is expanded by the air from the air supply device, and to bring a tip end of the second portion into contact with an inner peripheral surface of the lower end of the sidewall portion.

25. The substrate processing apparatus of claim 24, wherein the tip end of the second portion is formed as a contact band.

26. The substrate processing apparatus of claim 24, wherein the elastic body is a canted coil spring.

27. The substrate processing apparatus of claim 15, further comprising:

a conductor portion having a tubular shape and extending along the outer circumference of the substrate support, the conductor portion being grounded and slidable in a horizontal direction above a bottom portion of the chamber, wherein an outer peripheral surface of a top portion of the conductor portion is a tapered surface, the inner peripheral surface of the lower end of the sidewall portion is a tapered surface corresponding to the outer peripheral surface of the top portion of the conductor portion, and the outer peripheral surface of the top portion of the conductor portion and the inner peripheral surface of the lower end of the sidewall portion are configured to be in direct or indirect contact with each other.

28. The substrate processing apparatus of claim 27, further comprising:

a contact band disposed on the outer peripheral surface of the top portion of the conductor portion.

29. The substrate processing apparatus of claim 27, further comprising:

a thrust bearing disposed between the bottom portion of the chamber and a head of a bolt screwed to the bottom portion, wherein the conductor portion is slidably supported above the bottom portion of the chamber via the thrust bearing.

30. A maintenance method for a substrate processing apparatus, comprising: loading an inner wall member from the outside of a chamber of a substrate processing apparatus into the chamber through an opening of a sidewall of the chamber by a transfer arm, the substrate processing apparatus including the chamber, a substrate support disposed in the chamber, and a support member disposed above the substrate support, the inner wall member having a ceiling portion disposed above the substrate support and below the support member; and detachably fixing the inner wall member to the support member by moving one of the support member and the inner wall member in a vertical direction, wherein the inner wall member is fixed to the support member when a contact member attached to one of the support member and the inner wall member applies a spring reaction force to the other one of the support member and the inner wall member in a horizontal direction.

31. A maintenance method for a substrate processing apparatus, comprising:

allowing a transfer arm to enter a chamber of a substrate processing apparatus from the outside of the chamber through an opening of a sidewall of the chamber, the substrate processing apparatus including the chamber, a substrate support disposed in the chamber, a support member disposed above the substrate support, an inner wall member having a ceiling portion disposed above the substrate support and below the support member, and a contact member attached to one of the support member and the inner wall member, wherein the contact member is configured to detachably fix the inner wall member to the support member by applying a spring reaction force to the other of the support member and the inner wall member in a horizontal direction;

transferring the inner wall member to the transfer arm by moving the inner wall member downward using an actuator to release the fixing of the inner wall member by the contact member; and unloading the inner wall member from the inside of the chamber to the outside of the chamber through the opening.

* * * * *